(12) United States Patent
Bäuerle et al.

(10) Patent No.: US 9,397,075 B2
(45) Date of Patent: *Jul. 19, 2016

(54) ILLUMINATED GLASS PANEL FOR A VEHICLE, AND MANUFACTURE THEREOF

(75) Inventors: Pascal Bäuerle, Roye (FR); Adéle Verrat-Debailleul, Villers-sur-Coudun (FR); Christophe Kleo, Attichy (FR); Laurent Lamoureux, Ribecourt-dreslincourt (FR); Pascal Lefevre, Viry Noureuil (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 155 days.

This patent is subject to a terminal disclaimer.

(21) Appl. No.: 14/236,021

(22) PCT Filed: Jul. 30, 2012

(86) PCT No.: PCT/FR2012/051792
§ 371 (c)(1),
(2), (4) Date: Apr. 2, 2014

(87) PCT Pub. No.: WO2013/017790
PCT Pub. Date: Feb. 7, 2013

(65) Prior Publication Data
US 2014/0204601 A1    Jul. 24, 2014

(30) Foreign Application Priority Data

Jul. 29, 2011   (FR) ..................... 11 57011

(51) Int. Cl.
*H01L 29/16*   (2006.01)
*H01L 21/00*   (2006.01)
(Continued)

(52) U.S. Cl.
CPC ........ *H01L 25/167* (2013.01); *B32B 17/10541* (2013.01); *B60J 1/00* (2013.01);
(Continued)

(58) Field of Classification Search
CPC .... B60Q 3/0213; B60Q 1/268; B60Q 1/2696; B60Q 17/10541; F21S 48/22; F21S 48/30; F21S 48/2225; H01L 25/167; G02B 6/0095

USPC ........ 438/23–31, 46, 47; 257/80–86; 264/1.1, 264/1.7; 156/99, 107, 109
See application file for complete search history.

(56) References Cited

U.S. PATENT DOCUMENTS 8,829,539 B2 *  9/2014  Kleo ................ B32B 17/10018
                                                        257/82
9,006,751 B2 *  4/2015  Kleo ................ B32B 17/10036
                                                        257/82

FOREIGN PATENT DOCUMENTS

CN         101634413 A    1/2010
EP         0 721 086      7/1996
(Continued)

OTHER PUBLICATIONS

International Search Report as issued for International Application No. PCT/FR2012/051792, dated Oct. 8, 2012.
First Office Action as issued in Chinese Patent Application No. 201280047899.1, dated Jul. 3, 2015.

*Primary Examiner* — Calvin Lee
(74) *Attorney, Agent, or Firm* — Pillsbury Winthrop Shaw Pittman LLP

(57) ABSTRACT

An illuminating glazing unit for a vehicle includes a first sheet made of mineral or organic glass, a peripheral light source with a support profiled member referred to as source support, the emitting region or face of the source facing the edge face, referred to as injection face, of the first sheet for a propagation of the injected light within the thickness of the first sheet, the first sheet then playing the role of guide for the injected light, a device of extraction of the guided light so as to form at least one illuminating region, the source support being within an accommodation surrounded by material and covered by a cover, the cover and the source support being removable from the glazing unit.

27 Claims, 12 Drawing Sheets

Figure 1H:
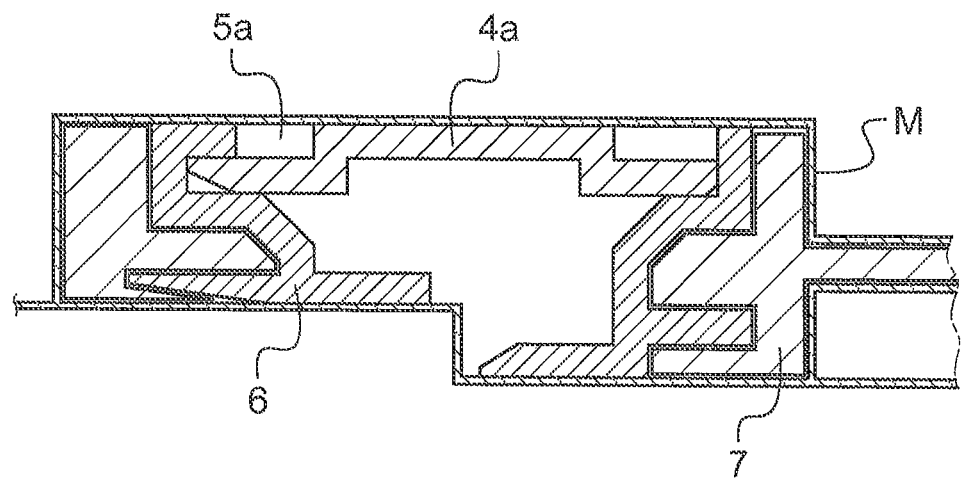

(51) Int. Cl.
*H01L 25/16* (2006.01)
*B60Q 3/00* (2006.01)
*B60Q 3/02* (2006.01)
*B60Q 1/26* (2006.01)
*B60J 1/00* (2006.01)
*B60J 7/00* (2006.01)
*B32B 17/10* (2006.01)
*F21V 8/00* (2006.01)

(52) U.S. Cl.
CPC *B60J 7/00* (2013.01); *B60Q 1/268* (2013.01); *B60Q 3/004* (2013.01); *B60Q 3/0213* (2013.01); *G02B 6/0095* (2013.01); *G02B 6/0035* (2013.01); *G02B 6/0091* (2013.01)

(56) References Cited

FOREIGN PATENT DOCUMENTS

| | | |
|---|---|---|
| EP | 1 107 389 | 6/2001 |
| EP | 1 495 910 | 1/2005 |
| FR | 2 937 711 | 4/2010 |
| JP | 11-217046 | 8/1999 |
| JP | 2010-009845 | 1/2010 |
| WO | WO 01/90787 | 11/2001 |
| WO | WO 2006/137660 | 12/2006 |
| WO | WO 2010/00496 | 1/2010 |
| WO | WO 2011/092419 | 8/2011 |
| WO | WO 2011/092420 | 8/2011 |

\* cited by examiner

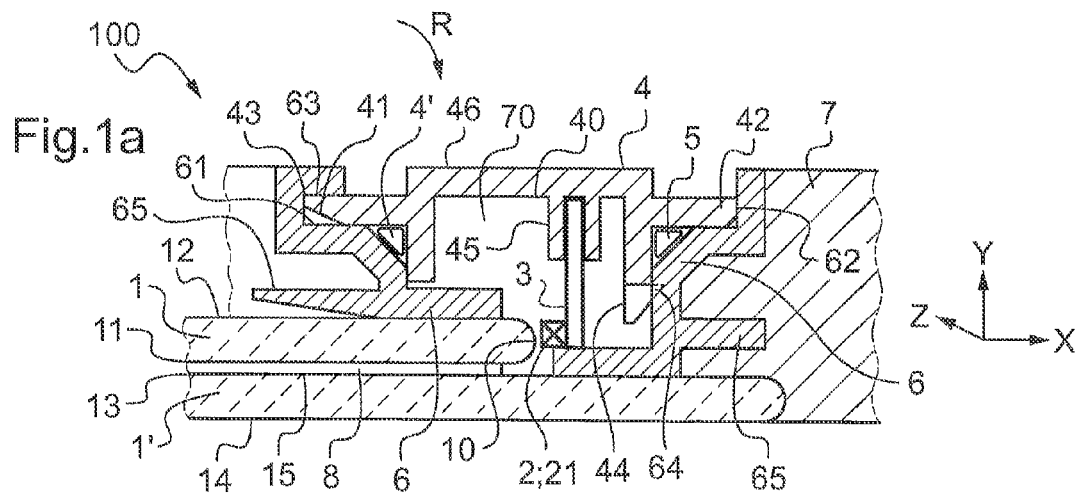
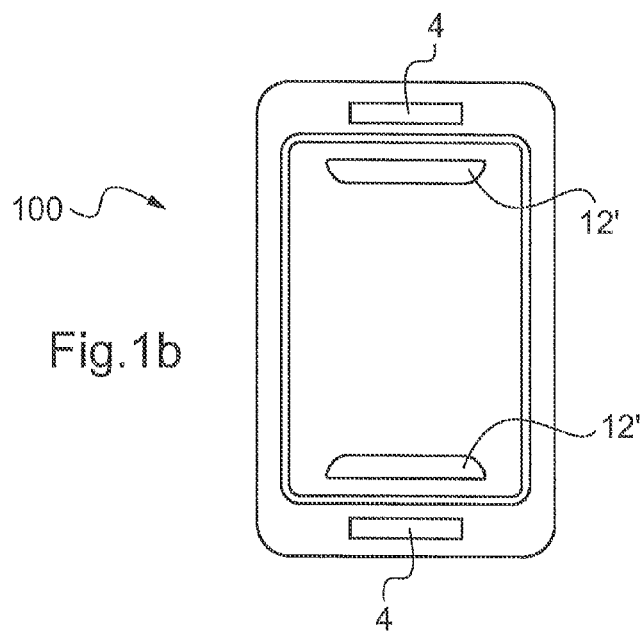
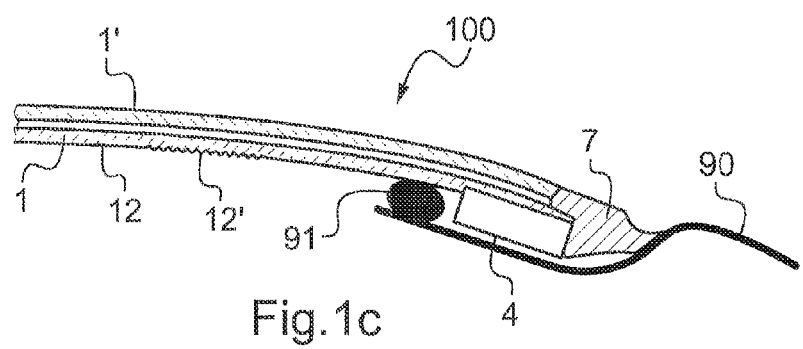

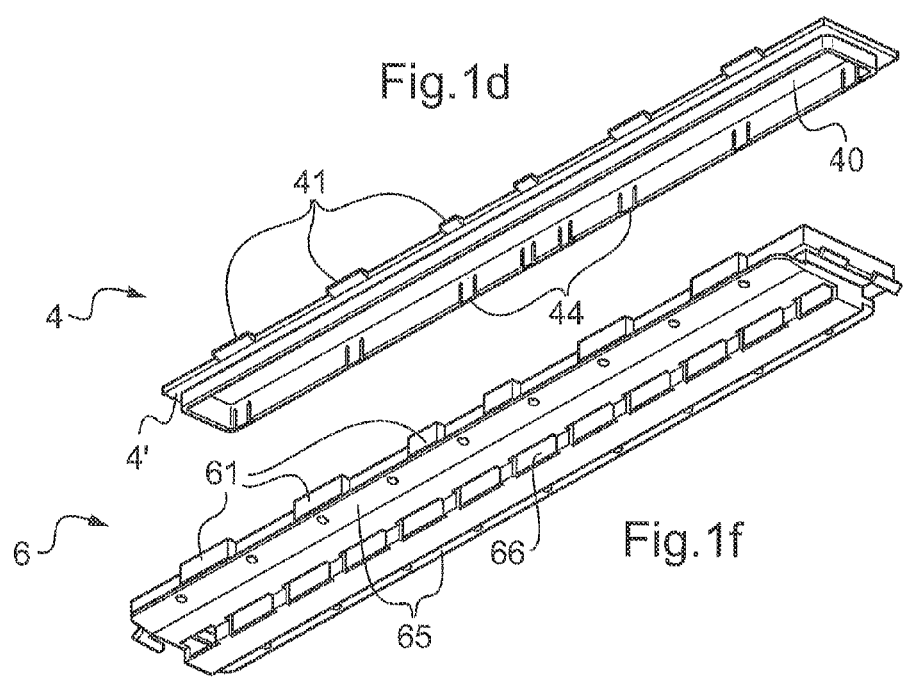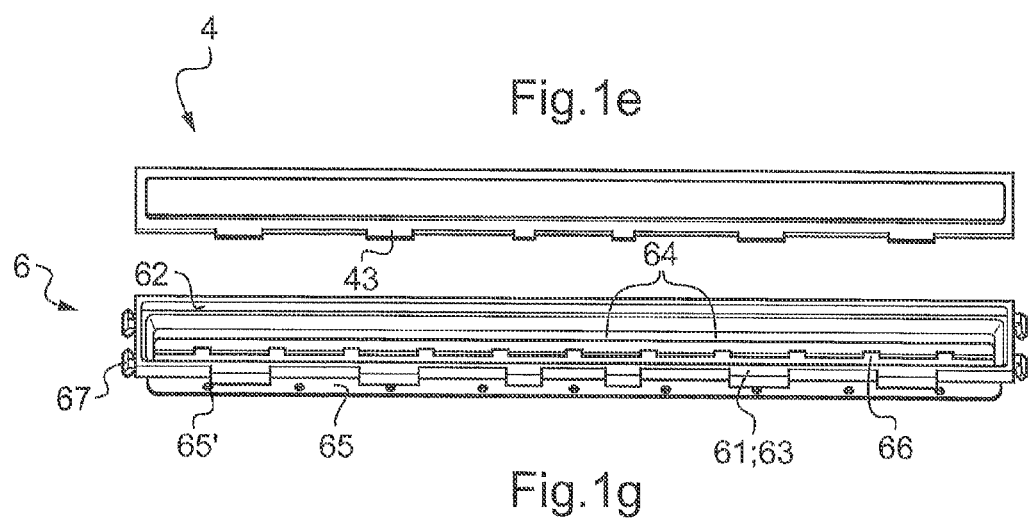

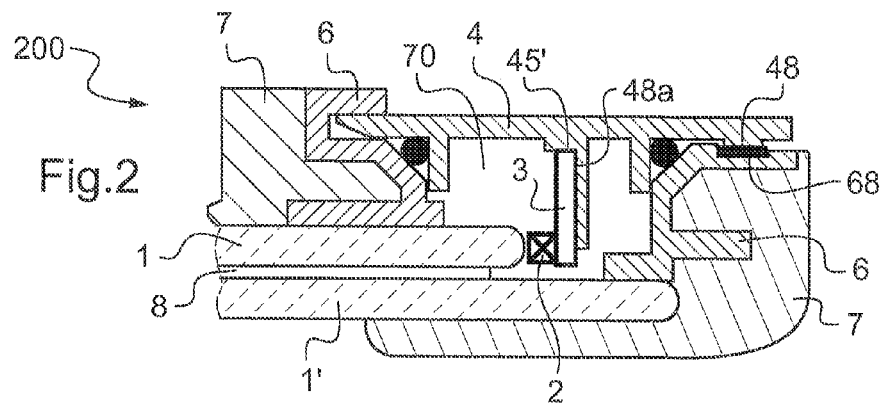
Fig.2
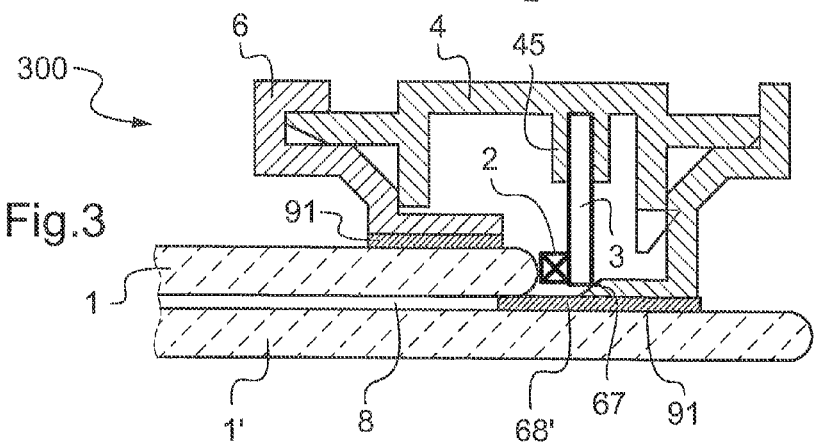
Fig.3
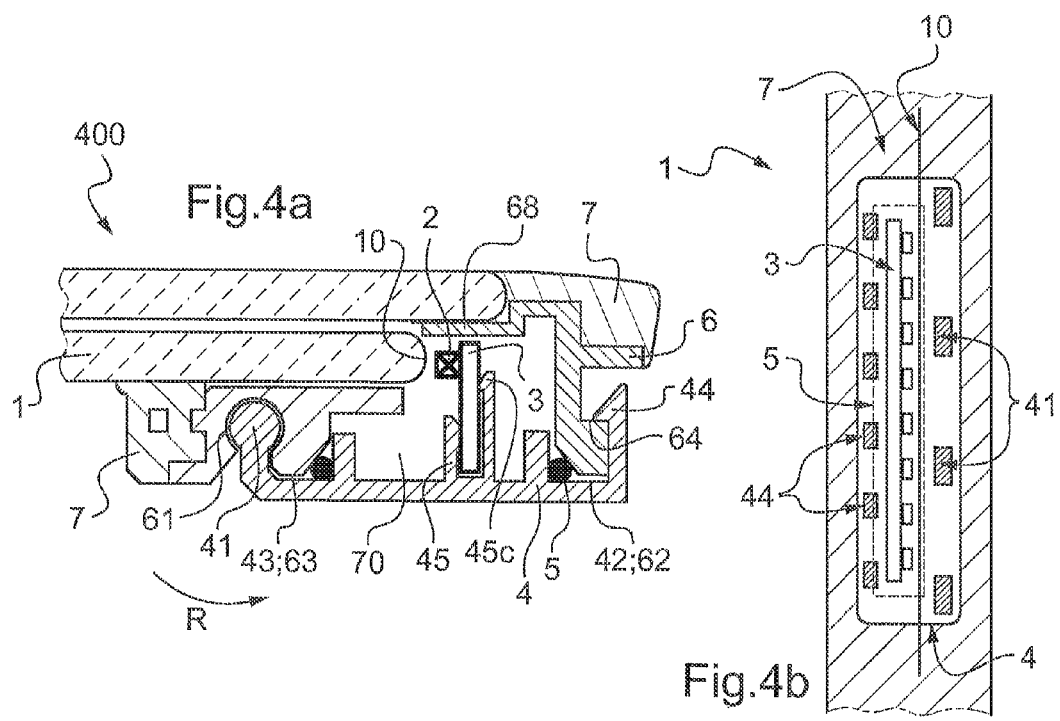
Fig.4a
Fig.4b

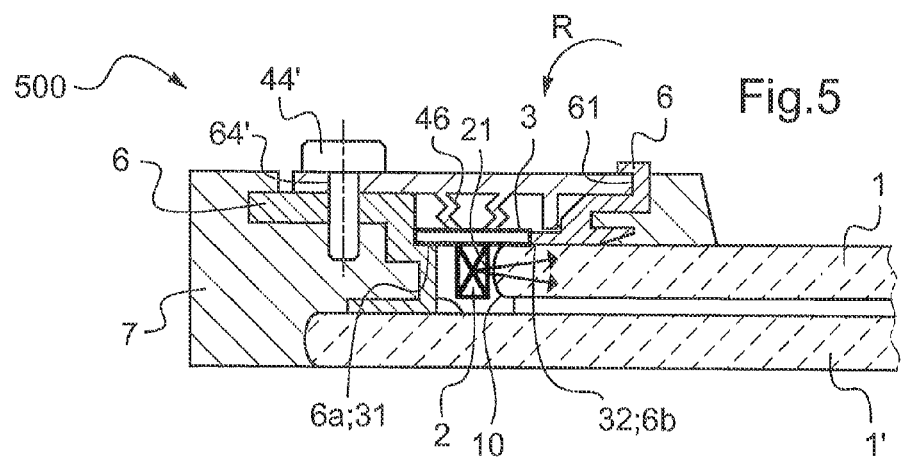
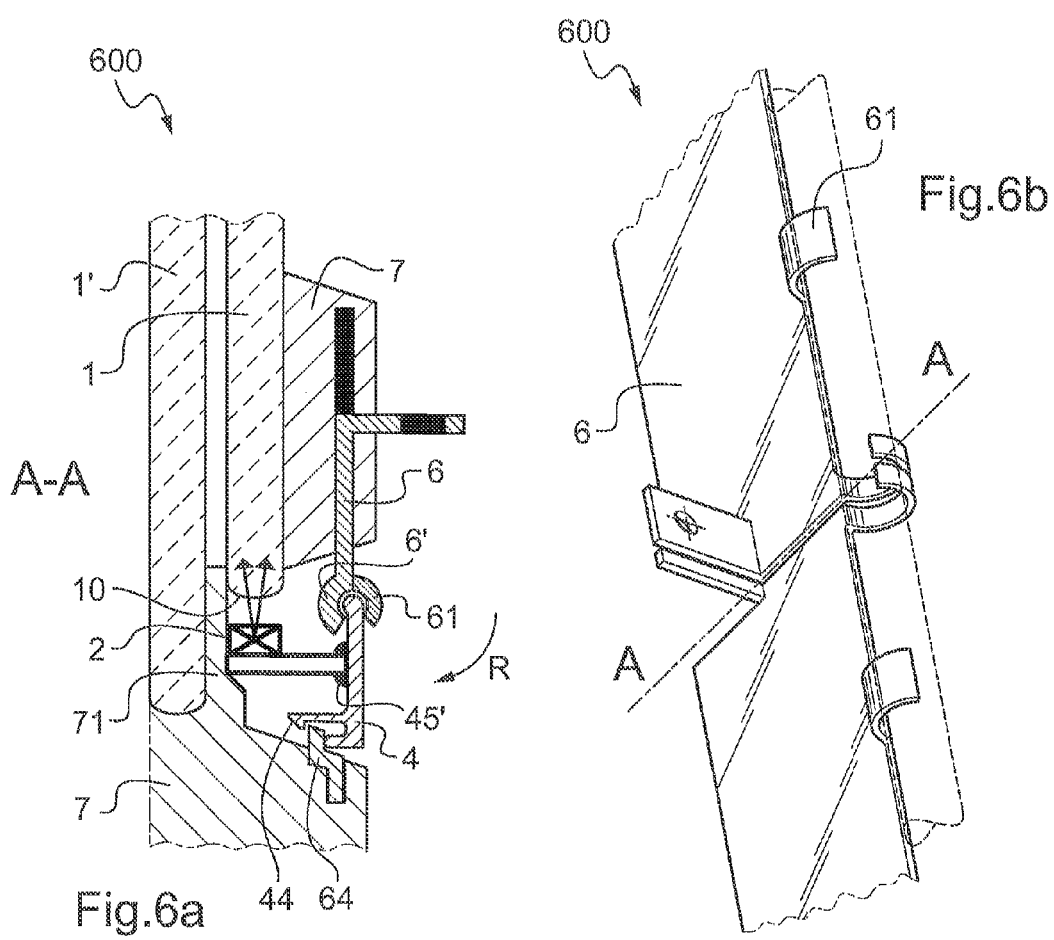

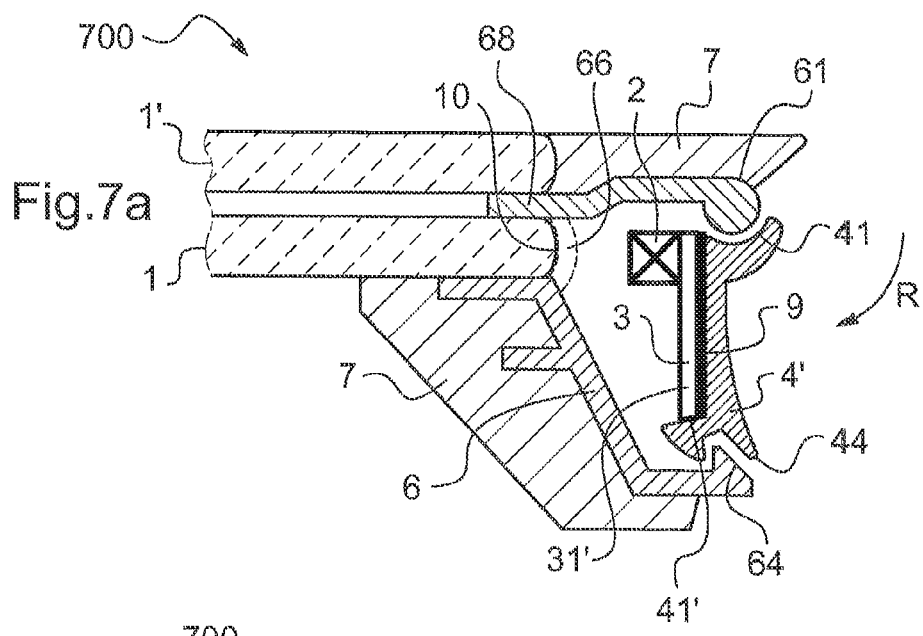
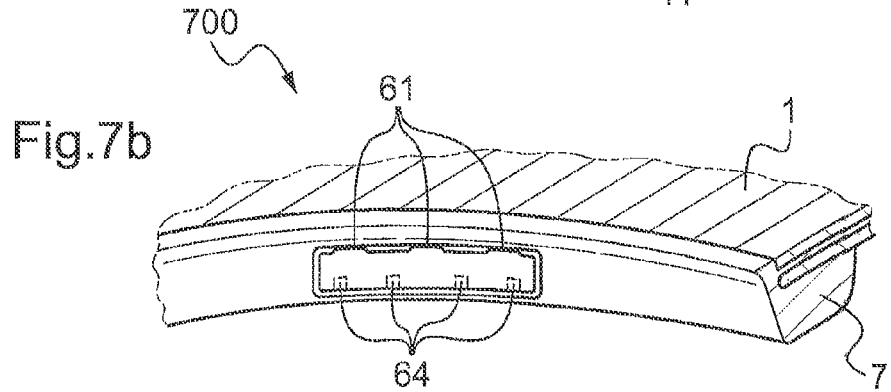
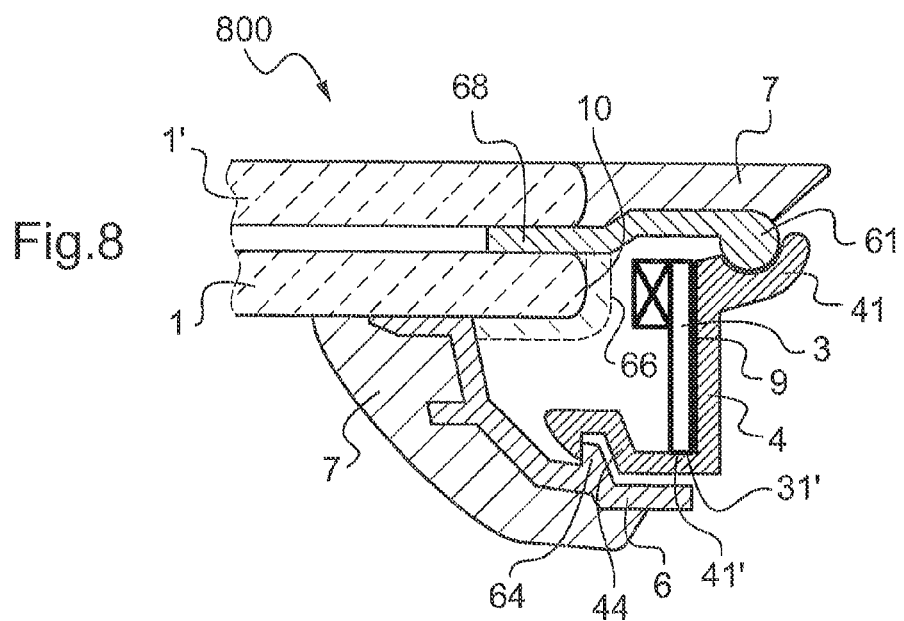

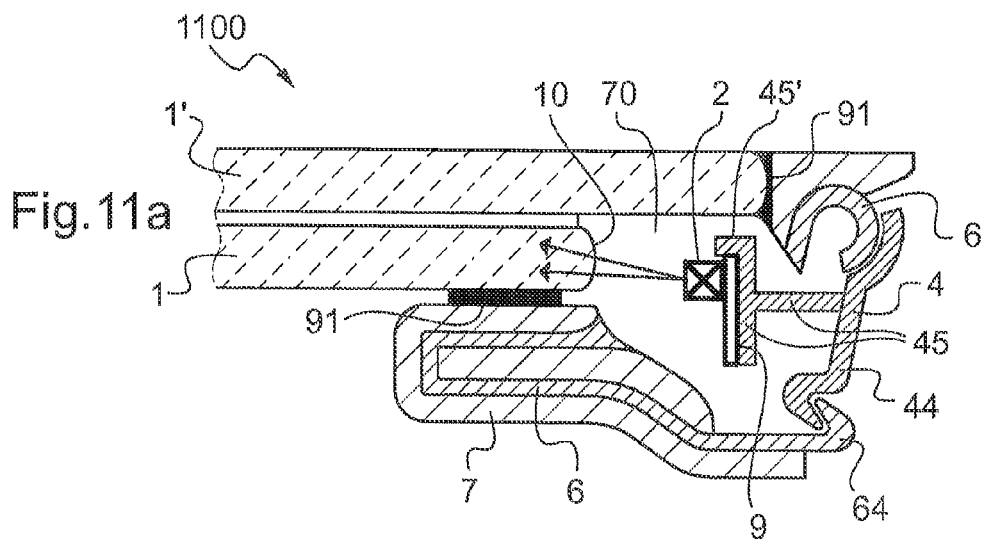
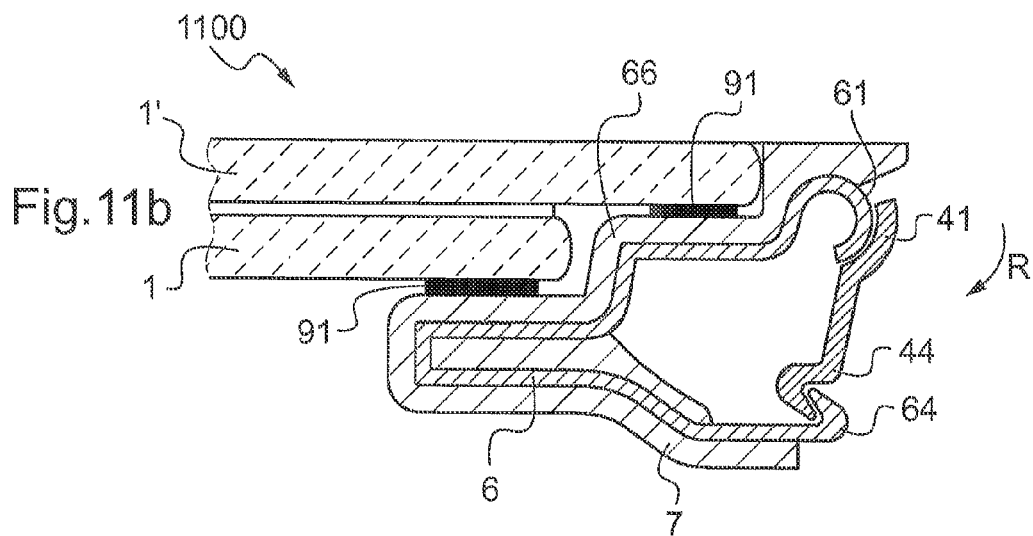
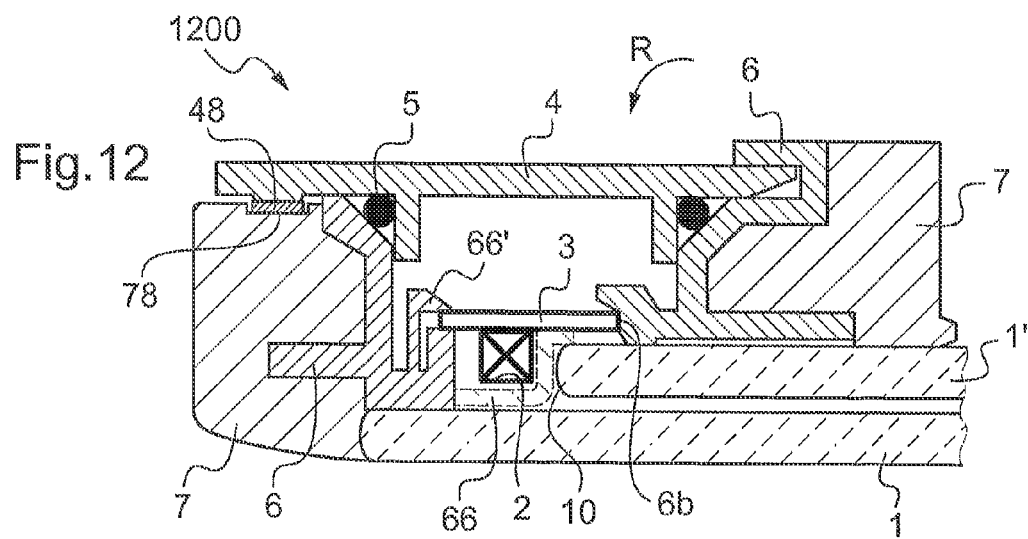

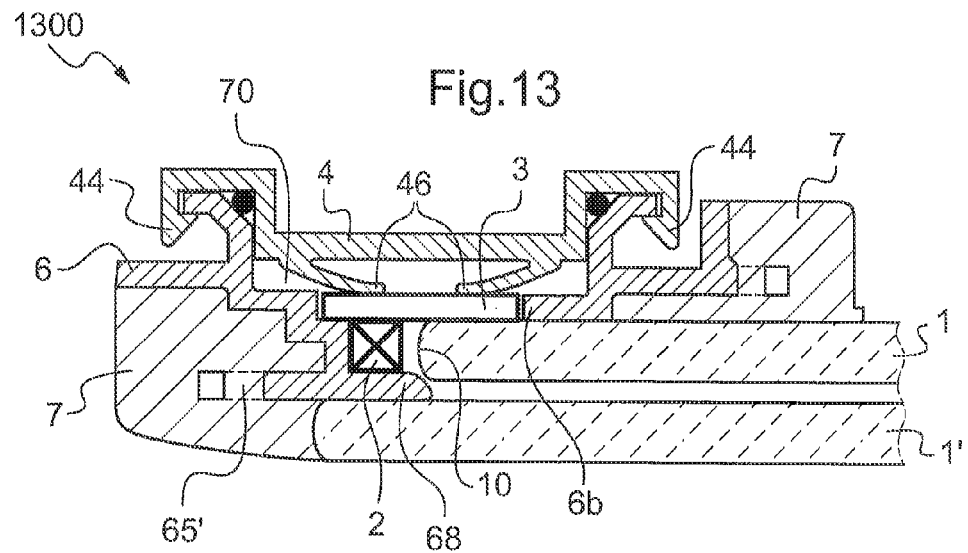
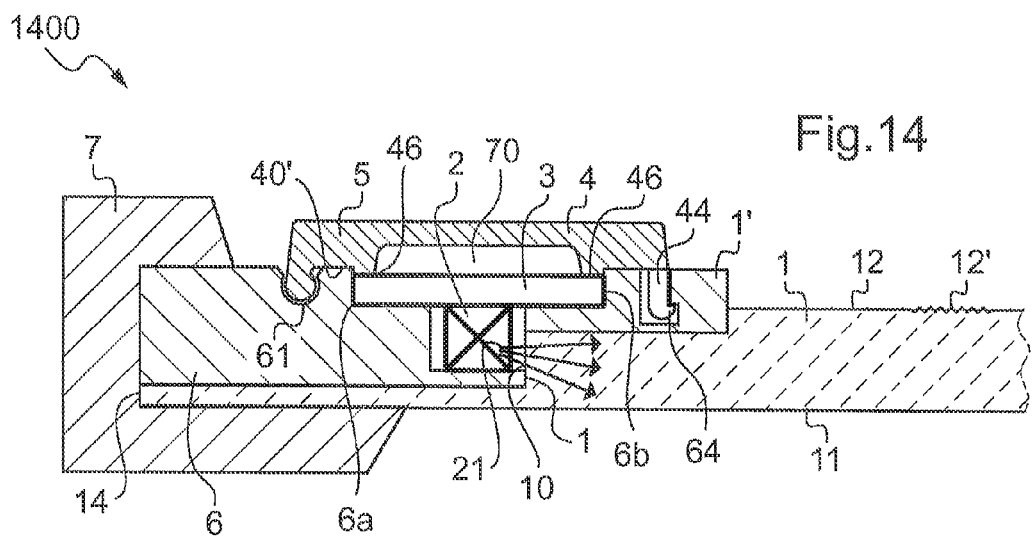
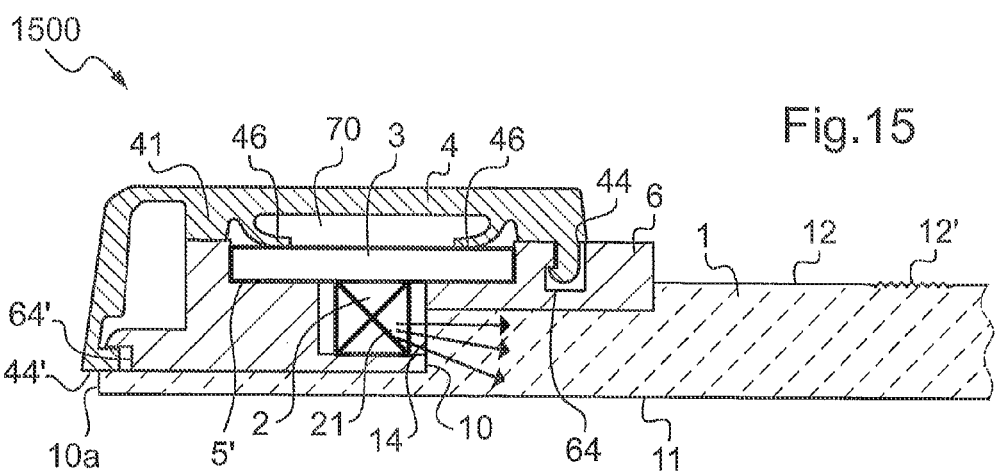

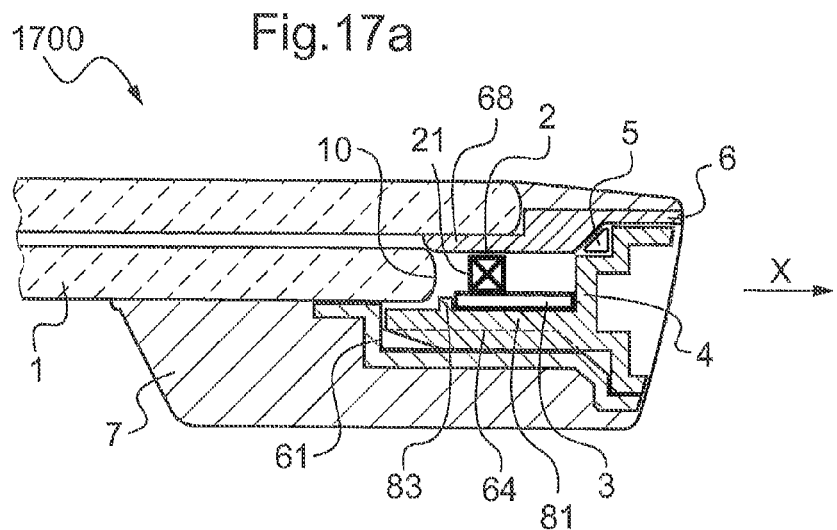
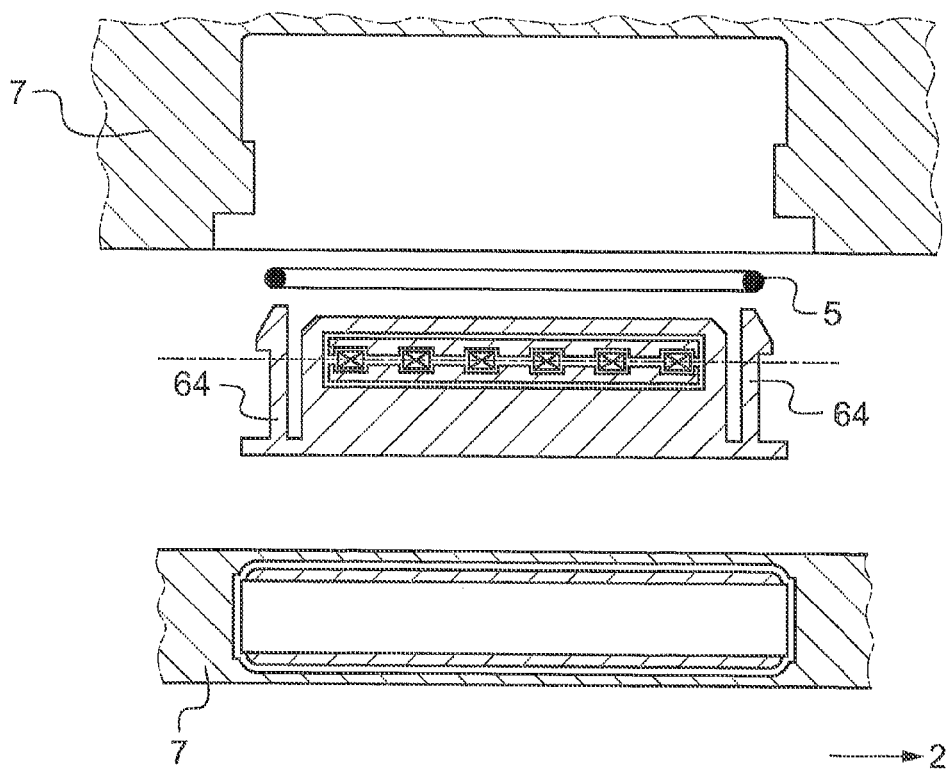

ILLUMINATED GLASS PANEL FOR A VEHICLE, AND MANUFACTURE THEREOF

CROSS-REFERENCE TO RELATED APPLICATIONS

This application is the U.S. National Stage of PCT/FR2012/051792, filed Jul. 30, 2012, which in turn claims priority to French Application No. 1157011, filed Jul. 29, 2011. The content of both applications are incorporated herein by reference in their entirety.

The present invention relates to vehicle glazing units, and in particular to illuminating glazing units for vehicles, notably using light-emitting diodes, and the method of fabrication of such vehicle glazing units.

Currently, vehicles are making increasing use of light-emitting diodes (or LEDs).

The document WO20100496 provides an illuminating roof using LEDs, illustrated in FIG. 16, and comprising:
- a laminated glazing unit comprising a first transparent sheet;
- having a first main face, internal to the vehicle, and a second main face associated with a lamination spacer and a second transparent sheet,
- a profiled member of the PCB (Printed Circuit Board) type as a support for the diodes which run around the periphery of the edge face of the first sheet so as to emit one or more types of radiation in the visible guided within the first sheet and extracted via the internal face
- the assembly of the profiled member and diodes (commonly referred to as diode bar or module) is enveloped in the polymer encapsulation made of black polyurethane peripheral to the glazing unit, the diodes being bonded to the edge face of the glass prior to the encapsulation by injection of polyurethane into a mold.

The costs of scrapping such glazing units are significant and these glazing units cannot be upgraded.

Accordingly, the present invention is aimed at an illuminating glazing unit for a vehicle using environmentally-friendly and efficient light sources (light-emitting diodes, optical fiber(s) coupled to diodes for example), that is robust and readily upgradable, while at the same time remaining simple and compact, thus complying with the specifications imposed by vehicle manufacturers (manufacturer's warranty, adaptability of the performance characteristics, etc.).

The invention is notably suitable for any configuration of roof, and particularly the roofs installed from the outside of the bodywork roof, opening or fixed roofs.

For this purpose the invention provides an illuminating glazing unit for a vehicle comprising:
- a first sheet made of mineral or organic glass having a first main face and a second main face and an edge face,
- a peripheral light source with a support profiled member referred to as source support, which source is chosen from between a self-supporting optical fiber of the ribbon type with a lateral part forming the emitting region and from light-emitting diodes each comprising a semiconductor chip with an emitting face, the support profiled member for the diodes being of the printed circuit board type, the emitting region or face facing the edge face, referred to as injection face, of the first sheet for propagation of injected visible and/or ultraviolet light, referred to as UV, within the thickness of the first sheet, the first sheet then playing the role of guide for the injected light,
- means of extraction of the guided light so as to form at least one illuminating region,
- the source support being within an accommodation surrounded by material (injection edge face could be within a cutout of the sheet of glass, and/or separate assembly element of the pre-assembled component type (enclosing the accommodation), and/or coating or polymer overmolding of the flexible encapsulation type such as PU or of the rigid type such as PC (notably hollowed out polymer in order to form the accommodation) and covered by a cover (notably which is leak tight to fluid(s), notably to liquid water or water vapor and to dust particles)),
- preferably, the distance (and the alignment) between the emitting face (of the diodes) or emitting region (of the optical fiber) and the injection edge face is controlled by positional locating means and positional holding means, referred to as blocking means, of the source support (diode support or self-supporting optical fiber) in the three directions of an orthogonal reference frame, said positional locating and blocking means comprising a system for assembly of the source support, associated with the first sheet (at least on the first main face which could be by adhesive bonding, or even also associated with a second sheet on its main face, opposite to the main face, facing the first sheet or on the edge face), including an assembly element (separate component or overmolding, as distinct from a sheet of mineral glass) positioned with respect to the injection to edge face,
- the cover and the source support notably for diodes or self-supporting optical fiber being removable from the glazing unit (support removable on its own or with the cover), notably at least by the removable or reversible means for holding the cover in position (carrier of the source support) and/or the reversible means for holding the source in position (source support independent from the cover, on the assembly element).

According to the invention, an XYZ reference frame may for example be defined in which:
Z is the longitudinal direction of the injection edge face,
Y is the transverse direction of the injection edge face (hence normal to the general faces of the glazing unit),
X is the direction normal to the injection edge face (hence parallel to the general faces of the glazing unit).

The cover may be referred to as essentially facial (parallel to the mean plane of the glazing unit, of the first sheet), or is lateral (parallel to the mean plane of the injection edge face).

The removable solution according to the invention is preferred to the "monolithic" total encapsulation, notably overmolding (encapsulation material, etc.) already described or to coating with glue, with adhesive, in which the light source (such as for example LED bars) would be completely encapsulated, which solution renders the light source difficult to access without causing damage (glazing unit/LED, encapsulation, etc.) and thus preventing the re-use of this glazing unit.

Furthermore, total encapsulation is difficult to achieve and may deteriorate the source, in particular the LEDs (and/or their electronic circuit) already installed, leading to significant costs of rejects, except where precautions are taken rendering the fabrication complex.

The integration of LEDs into the automobile glazing unit already described therefore comprises several drawbacks;
- not possible to disassemble
- significant cost of rejects linked to the price of the light source module.

In the same way, the integration of the source such as an LED bar is difficult or even impossible in the case of an extrusion or of a molded component owing to the risk of degradation of the light function, glazing unit and seal.

The cover is easy to (re-)position, notably on the assembly element, and removable (may be disassembled and/or pulled off and is replaceable at a lower cost) if necessary:

for changing the light source (LEDs, etc.) and/or their electronic control during repairs, or recycling or the like, in order to handle new demands on optical performance desired by the client (change of color(s), of power, of frequency, of control) or by new standards imposed, and/or for adding sources (LED and/or optical fiber) and/or electronic controls in a glazing unit with the recess and such sealing means according to the invention.

The invention thus facilitates the modularity of the lighting provided on the glazing unit (glazing unit which is illuminating or able to become illuminating, variation of color, intensity, etc.)—for the logistics management of the production flows (advance factory assembly rather than at the request of the customer).

The invention reduces the impact of the integration of the source (LED, etc.) on the choice of the methods and materials and obviates the dependency on a fabrication technology because it offers a wide range of usable encapsulation or pre-assembly solutions.

The invention makes possible the fabrication of an illuminating glazing unit for vehicles with a functional element, usually mounted onto the glazing unit, notably fabricated according to the usual techniques (extruded, molded, etc.), the functional element being able to be modified in an appropriate manner (hollowed out) in order to accommodate the LEDs after assembly.

The cover both protects and allows an easy access to the light source and preferably participates in its holding/positioning in the accommodation.

The cover (in some configurations) is not visible after mounting onto the body of the vehicle.

The positioning of the source support on the cover may be managed by the process (positioning calculated by the trajectory of a robot). Preferably, the positioning of the source support on the cover is managed mechanically preferably by end stops in order to simplify the handling of the replacement.

The installation of the source support facing the injection edge face may be managed by the process (positioning calculated by the trajectory of a robot). Preferably, the installation of the source support facing the injection edge face is managed mechanically preferably by end stops (of the assembly element) in order to simplify the management of the replacement.

The cover is distinct from the assembly element (notably itself different from a mineral glass sheet) and is preferably (at least in part) on the assembly element, for example:

positioned, notably mechanically, for example by end stops, on the assembly element and not on a mineral glass or even a flexible polymer encapsulation (overmolding) made of PU for example, and/or is held in position on the assembly element and preferably not on a mineral glass or even a flexible polymer encapsulation (overmolding), made of PU for example.

The system for assembling the source support preferably includes the cover, distinct from the assembly element.

Furthermore, the distance between the emitting face or region of the source and the injection edge face is controlled by virtue of the alignment means according to the invention which are the means for locating the source support (and preferably the cover) in position and the means for holding in position the source support (and preferably of the cover).

The emitting face (of the diodes, preferably a chip with its pre-encapsulation—of the silicone type, etc.) or region (of the optical fiber) can come in a controlled manner as close as possible to the injection edge face without risk of contact with the edge face.

Preferably, the distance between the emitting face or region (spaced from the edge face) and the injection edge face can be less than 2 mm, or even than 1 mm, notably from 0.2 to 2 mm or even from 0.5 to 1 mm.

According to the invention, all of the components implemented for the assembly of the source are able to be locked: assembly element (for fixing), preferably cover, and source support (diode support or self-supporting fiber).

The assembly element, distinct from the (mineral) glass or guiding sheet, is for example a separate component or a coating of the overmolding type, and is sufficiently rigid for the locking function.

The cover (with a curved or plane shape, in the form of an L, etc.) is a component that is sufficiently rigid for the locking.

The support for the source (PCB support for the diodes or non-emitting region for the "illuminating" optical fiber) may be held in position in a reversible fashion to the cover by means such as:

clip attachment: single and double clip, 'Christmas tree' type or single-branch type, clamping, screw attachment, "scratch" (or self-gripping strip) of the Velcro (registered trademark) type.

One or more end stop(s) notably on the assembly element are useful for the installation of the source support and/or the cover. As a first example, the diode support (for lateral emission), parallel to the first sheet, is placed on one side on the edge of the first sheet of glass and comes up against the assembly element and is placed on the other side on the assembly element and comes up against the assembly element. As a second example, the diode support (with lateral emission), parallel to the first sheet, is placed on the assembly element and comes into first and second end stops of the assembly element.

Preferably, any type of adhesive system (glue) is to be avoided, even if reversible, and also any attempt to assemble the cover using force onto the assembly element and/or the source support onto the assembly element (or even on the cover) should be avoided.

For the removal of the cover (with or without source support) or even of the source support (alone or carried by the cover), gripping means may be provided, notably: notch, loop, recess, rod, region of fragility, etc., preferably removable with a tool.

Preferably, the positioning of the cover, whether or not it carries the support, notably positioning on the assembly element, is not carried out under stress because that involves too great a deformation and thus does not allow a precise control of the position: there is no one possible position of the cover (notably with the support), but rather several.

Preferably, the positioning of the source support, notably on the assembly element, is not carried out under stress because that involves too great a deformation and thus does not allow a precise control of the position: there is no one possible position of the support, but rather several.

The means for locating the cover in position, notably on the assembly element, are preferably by contact(s) without deformation of the assembly element, notably chosen from amongst mechanical means such as:

end stop(s) in the assembly element for the cover preferably carrying the support, notably an inclined end stop, plane or linear bearing, single point bearing, ball-joint, pivot.

The positional locating means of the support on the cover are preferably:
- either by contact(s) without deformation of the cover, notably chosen from amongst mechanical means such as end stops, notably plane or linear bearing, single point bearing, ball-joint, pivot, using a permanent fixing by heading or removable by clip;
- or by interference fit (assembly under force, etc.)

The positional locating means of the support on the assembly element are by contact(s) without deformation of the source support, notably chosen from amongst mechanical means such as end stops, notably plane or linear bearing, single point bearing, ball-joint, pivot, with positional fixing of the heading type for example.

The source support may be disassembled from the glazing unit since it is carried by the removable cover of the glazing unit. The support may be fixed in a permanent manner (not readily removable) to the cover. This is the case where it is preferred to change the whole assembly comprising cover+ source support.

The cover does not necessarily play the role of maintaining the diode support in position, in which case holding the support in position is preferably (at least in part) handled by the assembly element.

The means for holding the support in position (via the cover for example) are preferably by contact(s) without overall deformation of the assembly element (no deformation or local deformation without influence on the positioning, once installed), notably chosen from amongst mechanical means.

The means for holding the cover in position, preferably on the assembly element (rigid) or a surrounding, notably a flexible encapsulation, are, reversible (removable) and preferably:
- clip attachment means, preferably on a rigid element,
- screwing means, preferably on a rigid element,
- means of the scratch or self-gripping strip type,
- magnetizing means, and/or the positional holding means for the source support which could be carried by the cover are reversible and notably:
- clip attachment means, preferably on a rigid element,
- screwing means, preferably on a rigid element,
- means of the scratch or self-gripping strip type,
- magnetizing means,
- or they could be permanent if carried by the cover (glue, etc.).

The clip attachment means (cover/assembly element and/or support/cover) may be single point (pins, etc.) or extended (in other words extending along the entire length of the cover), arranged on the internal face of the cover, preferably forming an integral part of the cover, preferably in the sealing region defined by the interface sealing element.

The clip attachment means are for example of the hook type, forming an integral part of the cover or added independently, preferably outside of the sealing region.

The screw attachment means (for the cover), such as screws or bolts, can protrude from the internal face, for example accommodated within perforations of the cover or forming an integral part of the cover, notably facial, possibly via blind holes, preferably within the sealing region, notably between the interface sealing element and the edge of the accommodation.

The means for holding the cover in position are preferably (at least in part) distinct from the means for locating the cover in position (otherwise this large component may move) and/or the means for holding the source in position are preferably (at least in part) distinct from the means for locating the source support in position.

The assembly element is for example:
- a monolithic annular (hence hollow with closed contours, around the periphery of the accommodation) component (attached to the first sheet), made of plastic that is sufficiently rigid and/or made of metal, notably associated with (on) a polymer encapsulation peripheral to the first sheet, of the PU type,
- or a component (attached to the glazing unit) in several separate parts, made of plastic that is sufficiently rigid and/or made of metal, notably associated with (on) a polymer encapsulation, of the PU type, peripheral to the first sheet,
- or made of a polymer encapsulation material, overmolded to the first sheet with a local recess for accommodating the source, made of plastic that is sufficiently rigid, a wall bounding the recess being positioned with respect to the injection edge face, notably where the first sheet is made of bi-material polycarbonate (transparent and opaque on the periphery), the assembly element being the dark part.

The support can be positioned in the assembly element by the positional locating means, and preferably the cover comprises or cooperates with elements which, in the installed position of the cover, are the means for holding the support in position within the assembly element.

Thus, the diode (source) support is (pre-)positioned independently of the cover on the assembly element, without a permanent attachment such as adhesive bonding, by positioning end stops with respect to the assembly element (made of a sufficiently rigid material), and a flexible element, notably of the curved tab or spring type, pushes against the support and forms the means for holding the support in position.

The cover can carry the source support which is positioned by means of elements for locating and holding in position (temporary or permanent) according to the three axes of the orthogonal reference frame, and the cover is positioned with respect to the assembly element and/or to the edge face of the glass (end stop for example normal to the internal face of a lateral cover, protruding with respect to the diodes and abutting against the injection edge face outside of the diode area) by means of other elements for locating and holding in position according to the three axes.

The assembly of the cover, potentially carrying the source support or carrying means for holding the pre-positioned source support in position (preferably mechanically, by end stops of the assembly element), is by rotation and reversible attachment (reversible or removable attachment, preferably mechanical, notably forming the means for holding the cover in position by clip or screw or scratch attachment onto the assembly element, internally or externally) notably onto the assembly element, said cover with a longitudinal base (the base could have a greater extent than the accommodation) having first and second parts:
- the first part (end) pushing against a first part of the assembly element referred to as rotational guiding part, the first part is (installed) mobile in rotation with respect to the glazing unit, according to an axis of rotation (fixed or mobile axis depending on the assembly) notably parallel (for example offset) to the injection edge face (to the mean plane if injection edge face curved or beveled), a metal and/or plastic part preferably sufficiently rigid,
- the second part carrying reversible means for holding the cover in position, preferably received in one or more regions, referred to as reception regions, of a second part of the assembly element, referred to as connection part, or conversely the second part carrying one or more regions, referred to as reception regions, receiving reversible means for holding the cover in position of a second part of the assembly element, notably made of metal and/or sufficiently rigid plastic, referred to as connection part, which could be received in a flexible material (polymer encapsulation) for holding by a technique of the scratch or self-gripping strip type.

The assembly by rotation—temporary fixing limits the risks of the light source banging into the material surrounding the source (diodes, etc.) accommodation, notably on the edge face of the glass, and hence getting broken.

The assembly by rotation—temporary fixing does not require much clearance in "Y" (for the attachment mechanical operations), Y being the direction normal to the glazing unit where the cover is facial (in the general plane of the glazing unit) or in "X" parallel to the glazing unit where the cover is lateral (in the plane of the edge face). This therefore provides an improved accessibility for assembly and dismantling.

Furthermore, the rotation offers a greater freedom of design notably for the orientation of the temporary positional holding means with respect to the injection edge face.

A temporary attachment external to the accommodation (clip or screw attachment) allows the size of the accommodation to be reduced.

The assembly by rotation—clip attachment is simple because is it is carried out in a single operation for the case where the source (diode support or optical fiber) is fixed (in a temporary/removable manner) on the cover.

The assembly by rotation—placing of the cover then screw attachment allows its removal without damage to the cover (hence reusable). The design of the cover and of the assembly element is simplified since it is an external component (screw) which allows it to be held in position/its reversible attachment, etc.

A double clip attachment of the cover onto the assembly element (preferably made of rigid plastic or of metal) is possible, does not require much space in width (in X for a facial cover, in Y where lateral), notably with respect to a rotation in a case with a wide support (PCB), but needs clearance (in Y) for the clipping operation.

The connection part of the assembly element is made of a material that is capable of holding the cover in place in a permanent manner and when force is applied, in other words the material must be sufficiently rigid and mechanically resistant.

In the case of plastic, the assembly guiding part—functional element (flexible plastic) can be obtained by co-extrusion (case of plastic) or bi-material injection.

In the case of metal, the assembly guiding part—functional element (flexible plastic) may be obtained:
- by co-extrusion (plastic material, notably TPE, EPDM), rollers at the entry of the spinneret allow the correct positioning of the strip and minimum thicknesses for the passage of material to be guaranteed, and additional steps for, drilling or cutting up may be necessary for liberating notably one or more stiffeners in the sections where the LEDs are located);
- by bi-material molding/injection (typically TPE, PVC), lugs in the mold allowing the correct positioning of the strip and minimum thicknesses for the passage of material to be guaranteed.

A functional element may notably surround the guiding part.

The metal center (strip) is preferably formed for example by successive folding operations (roll forming), or by stamping.

Various means may be provided for the rotation:
- the first end is, in part, beveled and the rotational guiding part preferably comprises a plurality of receiving regions (legs, of the hinge type but without a true "connection" of the cover to the assembly element) for the first end of the cover, along the cover, and preferably offset from one or more local reception regions, along the cover, for the reversible attachment means of the cover,
- the first end and the guiding part have complementary shapes: hemispheres, ball socket with fingers, etc.

The cover can carry the source support which is positioned by means of elements for positional locating and for holding it in position according to the three axes of the orthogonal reference frame:
- (the guiding and) the positioning in two directions of the orthogonal reference frame of the cover (preferably essentially lateral) with respect to the assembly element is carried out by a sliding connection (which could be curved), in the direction X if the cover is facial, in the direction Y if lateral, or even the direction Z, where the translational guiding motion may be combined with a rotation,
- holding the cover in position blocks the third direction of the orthogonal reference frame and hence ensures the positioning between the emitting face or region and the injection edge face.

The assembly element may be surrounded by, or even mechanically anchored in, an overmolding (flexible of the PU type), or could be covered by a pre-assembled seal (locally hollowed out for removal of the cover).

The cover can be of the drawer type (full) with a plane part carrying the source support. The end of the "drawer" cover may be beveled in order to facilitate the introduction of the drawer into the assembly element and in order for it to find its way to the final position at the end of travel. The LED (or source) support may be pinched by a lip ("interference fit" installation, holding in position by a slight deformation of the component).

Clips can be situated in the lower part and distributed along the drawer. The clips are preferably offset (downward) with respect to the plane part so as to allow a deformation of the clip during the clipping operation without coming into collision with the LED or source support.

Otherwise, clips may be situated in the lateral parts of the drawer.

The positioning of the LED support (against end stops of the plane part) can, in part, be under the glass light guide.

The assembly element can comprise, in a non-emitting region, a part facing or even in contact with the injection edge face used as reference for the injection edge face and/or to form a stiffener (uniting for example the guiding part and the attachment part in an assembly by rotation and temporary attachment).

The cover and the assembly element are preferably made of a material substantially identical (and with the same rigidity) for example plastic or metal.

The assembly element can be fixed to the glazing unit (in a permanent manner), notably by adhesive bonding (to the first main face or to the second glass sheet), and/or is surrounded by a polymer encapsulation (overmolded, notably flexible, of the PU or TP type) over at least one region on the periphery of the glazing unit and then preferably comprises means of mechanical anchoring within the encapsulation, of the fins type preferably is with orifices, preventing movement even if the adhesion is not perfect, the anchorage being useful notably for the correct positioning of the diodes.

It is preferred to avoid making a fixing hole for the assembly element in the glazing unit (the first sheet notably of mineral glass), for example for a screw attachment of the assembly element.

The assembly element (connection part, etc.) can preferably be made of:
rigid (thermo)plastic;
polycarbonate (PC), polymethylmethacrylate (PMMA), polyethylene (PE), polypropylene (PP), polyamide (PA66), acrylonitrile butadiene styrene (ABS), and their combinations ABS-PC, polystyrene (PS), acrylonitrile styrene acrylate ASA, based on formaldehyde polymer (polyoxymethylene POM), or on polybromated terphenyl (PBT), preferably loaded with glass fibers for even higher resistance, notably PA66 GF30 (30% glass fiber);
metal (steel, aluminum, etc.).

The assembly element is optionally surrounded by or in contact with or even forms part of one or more functional elements which notably provide the esthetic function, or aid with the flexibility of the contacts with the cover but which are too flexible to guarantee the holding of the cover:
for example flexible thermoplastics,
made of polyurethane, notably PU-RIM (Reaction In Mold),
thermoplastic elastomer (TPE), notably composed of styrene ethylene butadiene styrene SEES/polypropylene (PP), thermoplastic TPU, polypropylene PP/EPDM,
polyvinylchloride (PVC), terpolymer ethylene-propylene-diene (EPDM).

The assembly element (the connection part, guiding part, etc.) may be glued onto the glazing unit preferably by a double-sided tape/adhesive (acrylic, etc.), or potentially by PU bi- or single-component adhesive. The bonding is also possible notably onto a flexible part forming part of and surrounding the connection part. Fixing by screw attachment is preferred.

The glazing unit, and preferably the assembly element, comprises a metal sheet (pre-assembled sheet on a plastic or metal member), forming an anti-stray-light component, arranged (in parallel) along the first main face beyond the emitting face or region and potentially sitting proud of the injection edge face (notably in the case of a flush polymer encapsulation).

When the glazing unit is laminated, the metal sheet preferably extends into a set-back region of the lamination spacer.

The assembly element may be a functional element chosen from amongst:
an insert for fixing the glazing unit onto the vehicle (for example inserts for fixing opening roofs onto the bodywork) or an additional element onto the glazing unit (for example clip used for fixing a trim onto the glazing unit),
the metal central section of a pre-assembled seal being locally hollowed out, potentially covered with a polymer material (outside of the regions for positioning and/or for holding in position).

The glazing unit preferably comprises a plurality of assembly elements in the form of monolithic elements that are aligned and locked into one another by temporary fixing means (with lateral positioning of one assembly element with respect to the other).

The assembly element can preferably form a single-face hollowed out component with a closed contour such as a frame.

The assembly element may be on one region or over the entire length of a strip (one side of the glazing unit), or it may be over 2 adjacent or opposite strips, or around the whole periphery.

The accommodation can have any possible shape: oblong, oval, rectangular, etc.

The width of the accommodation can be in the range between 5 and 200 mm and preferably between 10 and 40 mm.

The length of the accommodation can be in the range between 10 and 1000 mm, preferably between 50 and 600 mm.

The accommodation is of sufficient depth, for example from 1 mm to 100 mm, preferably from 2 to 20 mm (or even less if facing the edge face).

As already mentioned, a peripheral functional element may be associated with the first sheet. The functional element may be an encapsulated element, an extruded element, a pre-assembled seal (lick-seal), a molded component, injected component, etc.

The functional element is directly on the first sheet or is on the first sheet indirectly, for example via a reinforcement or adhesion element.

The functional element can thus be attached to the glazing unit by any means:
direct adhesion of the material (molded, etc.),
gripping or fitting,
connection means of the glue type, etc.

The functional element may be single-face, bi-face, or even tri-face.

As already seen, the illuminating glazing unit for a vehicle can notably comprise an overmolded functional element, made of polymer, and preferably between the encapsulation and the glazing unit, notably made of mineral glass, a primer, single-, bi- or tri-component layer, for example containing polyurethane, polyester, polyvinyl acetate, isocyanate.

The functional element can be a polymer encapsulation, notably with a thickness from 0.5 mm to several cm, obtained by overmolding.

In vehicle applications, the encapsulation material is generally black or colored (for esthetic reasons and/or for masking purposes). The encapsulation can be made of polyurethane, notably of PU-RIM (Reaction In Mold). Other overmolding materials are:
flexible thermoplastics:
thermoplastic elastomer (TPE), notably compounds containing styrene ethylene butadiene styrene SEBS/polypropylene (PP), thermoplastic TPU, polypropylene PP/EPDM,
polyvinylchloride (PVC), terpolymer ethylene-propylene-diene (EPDM),
rigid thermoplastics:
polycarbonate (PC), polymethylmethacrylate (PMMA), polyethylene (PE), polypropylene (PP), polyamide (PA66), acrylonitrile butadiene styrene (ABS), and their alloys ABS-PC, polystyrene (PS), acrylonitrile styrene acrylate ASA.

The overmolding material may be colored, loaded with glass fibers.

The primer, single-, bi- or tri-component layer contains for example polyurethane, polyester, polyvinyl acetate, isocyanate, etc., for example with a thickness of 5 to 50 µm, between the encapsulation and the glazing unit in particular made of mineral glass, since this layer promotes the adhesion to a mineral glass.

The functional element also provides an excellent esthetic finish and allows other elements or functions to be integrated:

overmolding of frames, reinforcement inserts or inserts for fixing the glazing unit, notably for opening glazing units, profiled sealing element with multiple lips (double, triple, etc.), which are compressed after mounting on the bodywork, trim.

The overmolded functional element can be of any shape, with or without lips.

A tubing, in other words a profiled sealing element with closed cells, may also be set next to the overmolded functional element.

Preferably for a roof, a flush encapsulation, in other words flush with one of the faces of the glazing unit, preferably the second face, is formed.

The illuminating glazing unit for a vehicle can comprise a functional element which is notably:

an overmolding or a glued element (seal, frame), an insert for fixing the glazing unit on the vehicle (for example inserts for mounting opening roofs onto the bodywork) or an additional element onto the glazing unit (for example clips used for fixing trim onto the glazing unit)

the metal central section of a pre-assembled seal being locally hollowed out, potentially covered by a polymer material (flexible, etc.), outside of the regions for positioning and/or for holding in position.

The functional element can be a polymer seal, preferably made of elastomer, notably of TPE (thermoplastic elastomer), or EPDM, with a thickness of a few mm (typically between 2 and 15 mm).

The seal can be coated with adhesive in order to be fixed in place. The seal can be held simply by gripping or by fitting or by clipping (2 half-frames for example). The seal may be single-face, bi-face or tri-face. The seal can form a frame. The seal can take any shape: L-shape, U-shape, etc. The seal can be removable at any time. It may comprise by one or more lips under stress after fixing.

The functional element may be metal or polymer, polypropylene (PP), polyamide (PA66), polybutylene terephthalate (PBT), etc., loaded with glass fibers or otherwise.

The functional element conserves one or more standard functionalities for the glazing unit of a vehicle.

The functionality (single or multiple) of the functional element can be one or more of the following:

frame of the glazing unit (single-face, bi-face, tri-face as already seen), notably with a width on the first face of 3 to 100 mm, and thickness 10 to 40 mm, and/or component carrying elements for fixing or centering (in other words for a correct positioning of the glazing unit on the bodywork of the vehicle during the installation of the glazing unit at the factory), component for sealing against fluid(s) (liquid water, water vapor, cleaning products, etc.) between the glazing unit and the bodywork of the vehicle, at least limiting the passage of fluids between the to glazing unit and the bodywork of the vehicle, opaque and/or masking component, and/or component (specific, dedicated) for holding mechanical elements ("holder" for side window, etc.).

Preferably, the distance between the internal face of the cover and the first face is less than 10 mm.

Preferably, the distance between the external face of the cover and the injection edge face is less than 15 mm. The thickness of the cover can be less than 5 mm.

Furthermore, the space between the emitted radiation before injection, referred to as the coupling space, varies naturally according to the radiation diagram of the source, defined by a main direction of emission and an emission cone.

A material can be provided for filling the coupling space that is transparent to said radiation and is adhesive or otherwise, notably:

a foam, a thermoplastic resin, an adhesive material, of the glue type, burying the chips and fixing the chips to the glazing unit, a double-sided adhesive, stuck onto the chips and the support via one adhesive face and stuck to the glazing unit by the other adhesive face.

As adhesive materials (polymers, etc.) fulfilling where necessary a short-term sealing function, the following may be mentioned:

UV-reticulatable glue, an adhesive strip (acrylic, PU, etc.) coated with acrylic glue, a transparent glue, PU, silicone, acrylic, a thermoplastic resin: polyvinylbutyral (PVB), ethylene/vinyl acetate (EVA) copolymer, etc.

However, the invention obviates the need to include an additional element such as the aforementioned (filling material and/or adhesive and/or sealing material) in order to achieve the optical coupling between the LEDs (naked or pre-encapsulated) or the optical fiber and the glazing unit. Such elements lead to a higher cost and are likely to modify the color of the light.

Thus, advantageously, the space of radiation emitted prior to injection, known as the coupling space, is gaseous (one or more gases, for example air).

Any walls (assembly element, cover, etc.) are notably avoided within the coupling space.

The diodes can be (pre-)encapsulated, in other words comprising a semiconductor chip and an envelope, for example made of resin of the epoxy type or of PMMA, encapsulating the chip and whose functions are manifold: diffusing or focusing element, wavelength conversion. The envelope is common or individual.

The diodes can preferably be single semiconductor chips for example with a size of the order of a hundred µm or one mm.

The diodes may optionally comprise a protective envelope (temporary or otherwise) so as to protect the chip during handling or in order to improve the compatibility between the materials of the chip and other materials.

The diode may notably be chosen from amongst at least one of the following light-emitting diodes:

a diode with side emission, in other words parallel to the (faces of) electrical contacts, with an emitting face being lateral with respect to the support, a diode whose main direction of emission is perpendicular or oblique with respect to the emitting face of the chip.

The source support profiled member can, for its part, be on the edge periphery of the glazing unit: on the edge face of the first sheet and/or on the lower face of the first sheet and/or on the upper face of the first sheet.

The source support profiled member can have a length (and/or respectively a width) less than the length (respectively width) of the coupling edge of the first sheet.

The diode support profiled member may be a conventional PCB or may be metal.

The diode support profiled member can have a rectangular cross-section.

The total number of diodes and the power of the diodes are chosen according to the size and the location of the regions to be illuminated, the desired light intensity and the required uniformity of light.

The length of the diode support profiled member varies according to the number of diodes and to the extent of the surface to be illuminated.

The diode support profiled member has a length for example of around 20 cm. The number of LED bars (profiled member+LED) is preferably multiplied so as to cover the surface area.

In order to increase the compactness and/or for a simplified design, the diode support profiled member may furthermore exhibit one of the following characteristics:
  may be thin, notably with a thickness less than or equal to 1 mm, or even less than or equal to 0.1 mm,
  may have a metal surface coating for electrical conduction.

Several identical diode or similar support profiled members may be provided instead of only one support profiled member notably if the regions to be illuminated are very far apart or for illuminating a wide region.

A diode support profiled member may be provided with a given reference size multiplied depending on the size of the glazing unit and on the needs.

For a greater compactness and/or in order to increase the region of clear glass, the distance between the part carrying the chips and the first sheet is preferably less than or equal to 5 mm.

The diode support may also be in several parts, one of which can have a function of support for the electrical circuit and the other the function of radiator for dissipating the heat. The space in the assembly element and/or in the cover may be exploited for accommodating this radiator and giving it an advantageous shape.

The source is spaced from the injection edge face (by air), and is not fixed to the injection edge face, and even the diode support is not fixed onto the glazing unit but to the cover for simplifying and accelerating the disassembly.

The material surrounding the source support (assembly element and/or overmolding for example) and the cover is leak tight to fluids.

The cover may be associated with an interface element, for the interface sealing to fluid(s) and to dust, notably to liquid water or even to water vapor.

The interface element leak tight to fluid(s), local, is for example on the periphery of the internal face of the cover or on one side of the cover, notably the interface element leak tight to fluid(s) forms a ribbon.

Thus, the illuminating glazing unit is durable, even when the glazing unit is not protected by the bodywork, and this is owing to the simple and adapted sealing means, eliminating pathways for the diffusion of fluid(s).

Furthermore, the assembly element associated with the cover and with the optional interface sealing element according to the invention is useful in particular for a protection of the source against humidity, notably for the chips, in order to avoid pollution of the coupling space (dirt, organic pollution, of the mold type, etc.), and preferably against cleaning products, or washing by high-pressure jet. This protection must be long-lasting.

In order to qualify the sealing against humidity in the long term, the wet poultice test may be employed. For example, the standard D47 1165-H7 used in the automobile industry describes the wet poultice test H7.

This test consists in soaking the component to be tested in cotton saturated in de-ionized water and in enclosing the whole assembly in a hermetically-sealed bag, then in placing it in an autoclave at 70+/−2° C. for 7 days. Subsequently, the parts are removed, cleaned of the saturated cotton and placed at 20° C. for 2 hours. The components can finally be observed and mechanically or functionally tested in order to evaluate the effect of the humidity on the system. This test corresponds to several years of natural aging in a warm and wet environment.

A test may also be used for cleaning by high-pressure water jet, like the test for resistance to the high-pressure car-wash D25 5376 used in the automobile industry: pressures up to 100 bars with a nozzle/car body distance up to 100 mm.

Alternatively or in combination, in order to facilitate disassembly and re-assembly, the interface sealing element, preferably on the periphery of the cover, can be a compressed material, the sealing by material compression being carried out by a closing force of the means for fixing the cover, notably the interface sealing element is chosen from amongst:
  a polymer seal, for example made of TPE, or EPDM, notably an O-ring seal, with sealing lip(s), the seal being notably in a clearance space or groove of the cover, or a groove in the functional element or in the assembly element or in the second face,
  a sealing profiled member on the functional element, chosen as a polymer, for example a lip or lips of encapsulation material or of a pre-assembled seal, notably made of EPDM, or on the internal face or one side of the polymer cover; or a sealing profiled member on the assembly element (single piece),
  a foam, notably acrylic foam, PU, rubber (EDPM, etc.), thermoplastic elastomers, made of TPE, of polyester, notably of single-component rubber polyester such as the product Dynafoam marketed by the company Saint-Gobain Performance Plastics.

The use of sealing adhesive can thus be avoided.

Alternatively or in combination, the source support at least (and even the chips) is equipped, advantageously prior to its integration into the glazing unit (during their fabrication, etc.), with at least one protection layer (single- or multilayer) against humidity and/or with an encapsulation such as a varnish of the silicone, epoxy or acrylic type.

This enables ready integration into the accommodation provided in the glazing unit (integration not requiring a complex management of the sealing between the cavity and the external environment).

More precisely, the protection layer protects at least the printed circuit, solder joints and connectors if not leak tight.

The diodes (at least the emitting face) are thus preferably not protected if already covered (pre-encapsulated) with silicone.

The LED bars are protected prior to incorporating them into the accommodation (cavity for the functional element, etc.). The protection can be of the protection varnish type (silicone, epoxy, acrylic, etc.), encapsulation or "potting" of the LED bar (silicone, epoxy, acrylic, etc.).

The tropicalization varnish marketed by Syneo, with an acrylic, PU or Silicone base, may be mentioned.

The protection varnish Abchimie may be mentioned. The deposition is by immersion, selective deposition or vaporization (layers of 25-50 microns).

Thanks to the protection layer, the perfect sealing between the surface of the cover and the cavity in the functional element is no longer indispensible but can be provided as a complement. The two sealing solutions may also be combined for greater safety, or else to avoid a degradation of the module due to the humidity in the air imprisoned in the cavity once the cover is place.

In any case, the cover is not necessarily leak tight (to fluids). It preferably protects from any entry of material that could get between the diodes—the source and the injection edge face but being leak tight to humidity and to liquid water is not necessary. The cover may have a hole for the passage of a wire for example.

Thus, the design of the interface between the cover and the assembly element is facilitated and the method of fabrication of the glazing unit is facilitated.

The cover may furthermore comprise a blind recess for the passage of the connection elements and may furthermore comprise
- the optional integration of the wires and electrical connection elements for power supply (for example from one bar of diodes to the other) prior to the integration of the diodes (overmolding of the wires or provision of grooves or channels in the module, etc.),
- a facility for bringing out the wires with respect to connectors for the main power supply (which may be the battery, a photovoltaic source, etc.) in the region of the casing by means of an integrated pin.

Furthermore, with a recess of given dimensions and a cover carrying the source, the invention allows a correct positioning of the diode with respect to the region of injection of the light.

In a third advantageous embodiment, simple to implement, preferably relating to sealing by compression, the first sheet is made of glass, notably organic, and notably of PC, with a blind hole within its thickness, from the second face (extending the overlying recess), for example a ledge, for accommodating the source facing the injection edge.

In an organic sheet, notably of plastic, it is indeed easier to form grooves and a peripheral recess than in a sheet of glass (mineral), notably dip-coated.

In one preferred embodiment, the hole is over the whole periphery of the second face and the cover forms a frame notably incorporating said fixing means (by screw or clip attachment, etc.).

The cover (notably a component with a general shape that is substantially plane) may be a trim, notably with the color of the bodywork of the vehicle, or is masked after installing the glazing unit on the bodywork, a cover for example along one edge or forming a frame.

The cover has for example a plane longitudinal base with, for example, a first beveled and protruding lateral end forming fins along the cover abutting against the assembly element in the shape of a C in local regions.

Preferably, the transmission factor of the first sheet around the peak of the radiation from the chips (perpendicular to the main faces) is greater than or equal to 50%, even more preferably greater than or equal to 70%, and even greater than or equal to 80%.

The glazing unit can have a layer referred to as a protection layer (a sheet, a film, a deposition, etc.) on one of the first or second faces or extending over said face. This layer can have a dual function:
- diffusion of light (for example flexible film of PU, PE, silicone which could be glued by acrylic glue),
- protection against radiation (IR, UV): sun shielding, low emissivity, etc.,
- anti-scratch,
- esthetic (tinted, with patterns, etc.).

For the coupling edge or edges of the first sheet, rounded edges can preferably be provided. In particular, in the case where the emitted radiation space is air, it is possible to take advantage of the refraction at the air/first sheet interface of suitable geometry (rounded edge, or even beveled, etc.) thus allowing the rays to be focused into the first sheet.

The glass may optionally have undergone a prior heat treatment of the hardening, annealing, dip-coating or forming type.

The glazing unit is single-layer, the first sheet being made of mineral or organic glass, notably of PC, PMMA, PU, ionomer resin, polyolefin, potentially bi-material.

The glazing unit can be laminated (several sheets) formed:
- from a first transparent sheet, mineral glass (float glass, etc.) or organic (PC, PMMA, PU, ionomer resin, polyolefin), thick or thin,
- from a lamination spacer made of a given lamination material,
- from a second sheet (opaque or otherwise, transparent, tinted, made of mineral glass, or organic with various functionalities: sun shielding, etc.).

As typical lamination spacer, PU used in flexible form may be mentioned, or a thermoplastic without plasticizer such as the copolymer ethylene/vinyl acetate (EVA), polyvinylbutyral (PVB). These plastics have for example a thickness between 0.2 mm and 1.1 mm, notably 0.38 and 0.76 mm.

As first sheet/spacer/second sheet may notably be chosen:
- mineral glass/spacer/mineral glass,
- mineral glass/spacer/polycarbonate,
- polycarbonate (thick or otherwise)/spacer/mineral glass.

In the present description, in the absence of specification, glass is understood to mean a mineral glass.

The edge of the first sheet of a single-layer or laminated glazing unit or of a double glazing unit can be cut away (edge trimming with recesses prior to dip-coating) in order to accommodate the diodes in it.

The first and/or second sheets may be of any shape (rectangular, square, round, oval, etc.), and be plane or curved.

The first sheet can preferably be made of soda lime glass, for example PLANILUX glass from the company SAINT GOBAIN GLASS.

The second sheet may be colored, for example made of VENUS glass from the company SAINT GOBAIN GLASS.

The laminated glazing unit comprises a second sheet, notably made of mineral or organic glass, which is laminated by a lamination spacer to the first sheet, and preferably
- the edge face of the first sheet comprises a marginal through-recess within the thickness where the source is accommodated, or the second sheet is protruding from the injection edge of the first sheet, creating a lateral ledge of the glazing unit,
- said marginal recess or said lateral ledge receiving the lower part (at least) of the recess of the functional element:

The glazing unit may be a multiple insulating glazing unit, under vacuum, notably a double or triple glazing unit formed:
- from a first transparent sheet, mineral glass (float glass, etc.) or organic PC, PMMA, PU, or even ionomer resin, polyolefin, thick or thin,
- from a second sheet spaced by a layer of gas (air or inert gas) (opaque or transparent, tinted, made of mineral or organic glass with various functionalities: sun shielding, etc.),
- from an optional third sheet spaced by a layer of gas (air or inert gas) (opaque or transparent, tinted, made of mineral or organic glass with various functionalities: sun shielding, etc.).

The glazing unit is a multiple glazing unit, notably a laminated glazing unit, a double glazing unit under vacuum or with insulator, or even a triple glazing unit with the recess essentially lateral, the cover or MASTIC essentially lateral, the first sheet being an external or central sheet of the triple glazing unit.

The means of extraction of the guided light, via the first and/or the second main face, are means of diffusion on the surface of the first and/or of the second main face or means of bulk diffusion in the first sheet, and/or when the injected light is UV, means of conversion of the UV light into visible light via the first and/or the second main face, which are luminophores notably on the first and/or on the second main face.

For the extraction of the light, means of diffusion are used, formed either by a surface treatment of the glass sheet of the sand blasting, acid etch, deposition of enamel or of diffusing paste type, or by a treatment in the bulk of the glass of the laser etching type.

The diffusing layer can be composed of elements containing particles and a binder, the binder allowing the particles to agglomerate together. The particles may be metal or metal oxides, the size of the particles can be in the range between 50 nm and 1 µm, preferably the binder can be mineral for resistance to heat.

In one preferred embodiment, the diffusing layer is composed of particles agglomerated in a binder, said particles having a mean diameter in the range between 0.3 and 2 microns, said binder being in a proportion in the range between 10 and 40% by volume and the particles forming aggregates whose dimensions are in the range between 0.5 and 5 microns. This preferred diffusing layer is particularly described in the application WO0190787.

The particles can be chosen from amongst semi-transparent particles and preferably mineral particles such as oxides, nitrides, carbides. The particles will preferably be chosen from amongst the oxides silica, alumina, zirconia, titanium oxide, cerium oxide, or a mixture of at least two of these oxides.

For example, a mineral diffusing layer of around 10 µm is chosen.

For a greater compactness and/or in order to reduce or increase the region of clear glass, the distance of the emitting face from the first sheet can be less than 2 mm. Notably, smaller diodes may be used for example chips without a lens and/or without pre-encapsulation notably with a width of around 1 mm, with a length of around 2.8 mm and a height of around 1.5 mm.

The illuminating region or regions (notably peripheral along one edge of the glazing unit, or opposite or adjacent edges, in a strip or strips, framing the glazing unit) form an internal ambiance lighting, an internal lighting for reading by side window, roof, etc., or an internal and/or external illuminated signaling display.

The illuminating region or regions are notably peripheral, in a strip or strips framing the glazing unit.

Adjustments are made to the extraction/the conversion of the radiation (together with the type and/or the position and/or the number of the diodes) for:
  ambiance or reading lighting, notably visible on the inside of the vehicle,
  illuminating signaling, notably visible from the outside:
    by remote control: detection of the vehicle in a parking lot or other, indicator of door (un)locking, or
    safety signaling, for example as a stop light on the rear,
  a substantially uniform illumination over the whole of the extraction surface (one or more extraction regions, common or individual function).

The light may be:
  continuous and/or intermittent,
  monochromatic and/or polychromatic.

Where visible on the inside of the vehicle, it can thus have a function of night-time lighting or of a display of information of any kind, of the drawing, logo, alphanumeric signaling or other identifying sign type.

As decorative patterns, one or more illuminating strips or a peripheral illuminating frame may for example be formed.

A single extraction face (preferably internal to the vehicle) may be implemented.

The insertion of diodes into these glazing units allows other signaling functionalities as follows:
  display of illuminating signaling indicators intended for the driver of the vehicle or for the passengers (example: engine temperature warning indicator in the automobile windshield, electric de-icing system activation indicator, for the windows, etc.),
  display of illuminating signaling indicators intended for persons outside of the vehicle (example: indicator for activation of the vehicle alarm in the side windows),
  illuminating display on the glazing units of vehicles (for example flashing light display on emergency vehicles, safety display with low electrical consumption indicating the presence of a vehicle in danger).

The glazing unit may comprise a diode for receiving control signals, is notably in the infrared, for remote control of the diodes.

The glazing unit is designed to equip any vehicle:
  side window of a terrestrial vehicle, notably an automobile, a utility vehicle, a truck, a train, notably with the functional element which is a component for holding a system of electric windows or with the cover trim,
  mobile or fixed roof of a terrestrial vehicle, notably an automobile, a utility vehicle, a truck, a train, with a first sheet that could be curved, notably a laminated glazing unit,
  windshield of a terrestrial vehicle, notably an automobile, a utility vehicle, a truck, a train, notably with the illuminating region or regions (forming an "HUD" signaling for example) in the periphery made of enamel or nearby, rear windshield notably in the periphery made of enamel or nearby,
  window or windshield of an airborne vehicle,
  window or roof glazing units of an aquatic vehicle, boat, submarine,
  double or triple glazing unit in a train or a bus.

Naturally, the invention also relates to a vehicle incorporating the glazing unit previously defined.

The invention is lastly aimed at a first method of fabrication of the illuminating glazing unit for a vehicle, comprising the following steps:

A solution for installation of the source, notably diodes, post-encapsulation is thus provided with the aforementioned advantages (limitation of rejects, source more easily accessible and/or added, etc.).

According to the design, the assembly element is self-supporting on the glazing unit, and the mold rests on it with pins during the overmolding process, or else an adhesive of the hotmelt type (PU or PA) may also be used.

The invention is lastly aimed at a method of fabrication of the illuminating glazing unit for a vehicle, comprising the following steps:
  the supply of the first sheet and of the optional second sheet followed by the placement and the attachment by adhesive bonding of the assembly element onto the first sheet and/or the second sheet,
  the assembly of the cover with the source support then of the cover on the assembly element, preferably by rotation then reversible attachment, or the assembly of the diode/light source support on the assembly element then the assembly of the cover on the assembly element and on the support, preferably by rotation then reversible attachment,
  or, in another embodiment, it comprises the following steps:

the supply of the first sheet and of the optional second sheet, followed by the placement into a mold, the placement into the mold of the assembly element on the first sheet and/or the second sheet (for example protruding) with a cover containing a seal, the closing of the mold over the cover, the compression of the seal, the overmolding by injection of a polymer encapsulation material (flexible), notably polyurethane or thermoplastic, the removal of the glazing unit from the mold and the removal of the seal from the region facing the injection edge face leaving the accommodation for the source, the assembly of the cover with the source support then of the cover on the assembly element, preferably by rotation then reversible attachment, or the assembly of the source support on the assembly element then the assembly of the cover on the assembly element and on the support, preferably by rotation then reversible attachment.

These methods of fabrication according to the invention are compatible with the industrial methods for glazing vehicles.

Other advantageous details and features of the invention will become apparent upon reading the examples of glazing units according to the invention illustrated by the following figures:

FIGS. 1 to 19 show partial schematic cross-sectional views of the illuminating glazing units for vehicles in various embodiments of the invention, except FIGS. 1*b*, 4*b*, 6*b*, 10*b*, 16*b*, 17*b*, which show partial schematic top views of the method of fabrication of the illuminating glazing unit for a vehicle for the embodiment of the invention in FIG. 1, FIGS. 1*d* and 1*e*, which each show a schematic bottom and top view, respectively, of covers according to the invention, FIGS. 1*f* and 1*g*, which each show a schematic bottom and top view, respectively, of the assembly element covered according to the invention, FIG. 1*h*, which shows the fabrication of the glazing unit.

It is pointed out that, for the sake of clarity, the various elements of the objects shown are not necessarily reproduced to scale.

FIG. 1 shows a partial schematic cross-sectional view of an illuminating glazing unit for a vehicle 100 in a first embodiment of the invention.

This glazing unit 100 comprises a laminated glazing unit comprising:

a first transparent sheet 1, for example rectangular, having a first main face 11 and a second main face 12, and an edge face 10, for example a sheet of silico-soda-lime glass, with a thickness equal to 2.1 mm, a second glass sheet 1', potentially for a sun screening function, tinted (VENUS VG10 glass for example from the company Saint-Gobain) and/or covered by a sun screening coating of thickness equal to 2.1 mm, and having a main face 13 and a free main face 14.

The second sheet of glass is laminated 1' by a lamination spacer 8, for example a PVB, with a thickness of 0.76 mm.

A profiled member 3 as a support for light-emitting diodes 2 runs along the periphery; for example longitudinal to the first sheet 1.

The support is a monolithic, thin profiled member 3 with a thickness equal to 0.6 mm (preferably 5 mm max), width of 7 mm and length of 20 cm. It can have a rectangular cross-section, be made of metal or be a conventional PCB.

The light-emitting diodes each comprise an emitting chip 2 capable of emitting one or more types of radiation in the visible guided within the first sheet 1. The diodes are of reduced sizes, typically a few mm or less, notably of the order of 2×2×1 mm, with or without optics (lens), non-pre-encapsulated in order to reduce the volume as much as possible, or encapsulated (by silicone) for its protection.

In the configuration illustrated, the emitting face 21 of the chip is the upper face (normal to the profiled member 3). The distance between the emitting face and the injection edge face is reduced as much as possible, for example 5 mm, or even between 0.2 and 2 mm. The main direction of emission is perpendicular to the face of the semiconductor chip, for example using an active layer with multiple quantum wells, using AlInGaP technology or other semiconductors. The light cone is a cone of the lambertian type, of +/−60°.

The extraction of the light 12' can take place via the second face 12 which is for example the lower face with respect to the vehicle notably in the case of a roof unit.

As a variant, UV LEDs are chosen, notably in the UVA, for exciting luminophores on the face 12 for example.

The extraction 12' is carried out by any means of diffusion on the surface of the second face 12: sand-blasting, acid etch, diffusing layer, serigraphy, etc., or as a variant, by laser etching within the first sheet 1.

For a given group of diodes, an emitted radiation space is defined between each emitting face (chip) and the edge face of the first sheet, referred to as optical coupling space, which is preferably a gaseous medium, typically air, without adhesive.

Each chip and the emitted radiation space must be protected from any pollution: water, chemicals, etc., and this must be a long-term protection such as during the fabrication of the glazing unit 100.

However, in a known manner, it is useful to provide the glazing unit with a polymer overmolding 7, for example with a thickness of around 2.5 mm, around the edges of the glazing unit, and preferably over the whole periphery of the glazing unit (here laminated) and of at least the second face 12.

For an encapsulation of the Flush type, for roof units in particular, it is preferred to leave the face 14 of the second glass 1' free. The encapsulation 7 is then referred to as bi-face.

In order to mask the source, or even to eliminate the stray light exiting upward, via the sheet 1', a peripheral masking element 15 may be used on the face 13 for example an opaque enamel (black, etc.).

This peripheral masking element 15 may also serve to mask the attachment to the bodywork.

As a variant, the encapsulation 7 is then referred to as tri-face and the masking element 15 can potentially be removed.

The overmolding 7 conventionally serves as an attractive esthetic finish and/or allows other elements or functions (reinforcement inserts, etc.) to be incorporated.

The overmolding 7 for example has a sealing lip between the glazing unit and the vehicle (not shown in FIG. 1, cf. FIG. 1*c*).

The overmolding 7 is flexible for example made of black polyurethane, notably of PU-RIM (Reaction Injection Molding).

The overmolding 7 has a recess 70 that is for example rectangular, as shown in FIG. 1*b*, accommodating the diode bar (the diodes on the support profiled member 3).

The overmolding 7 participates in the protection of the diodes, hence in the long-term sealing against fluid(s) (liquid water, cleaning products, or even water vapor, etc.) while at the same time conserving its original functionalities.

In order to limit as far as possible the width of overmolding against the edge face of the glazing unit, for example a width less than 10 mm, the first sheet 1 also has a marginal recess, or referred to as edge recess, the marginal recess being marginal forming an injection edge face 10, set back from the edge face not cut away which is not shown, and with a small radius of cutout so as to have a long region for positioning within the recess. This edge recess receives the lower part of the recess of the overmolding 70.

The glazing unit furthermore comprises a cover 4 for covering the diode bar 3, along the edge of the second face 12 and sitting proud of the injection edge face 10, which cover has a general face 40, referred to as internal face, oriented toward the first sheet, the face carrying the diode support 3 by means 45 forming a grip connection.

The cover 4 is a rigid plastic part with a longitudinal base of generally plane shape, and a rectangular contour (whose edges could potentially be rounded) as illustrated in FIG. 1d. The cover is referred to as facial because the base is facing (and parallel to) the main faces of the laminated glazing unit.

The cover 4 is easily removable for inserting diodes or changing them.

A system is provided for assembling the diodes by rotation—reversible attachment comprising:
  a peripheral assembly element 6, which is a monolithic component with a closed contour made of rigid plastic preferably the same (type of) material as the cover 4, associated with the first sheet 1, extending into the region of the injection edge face 10 here in the recess 70 and surrounded by the polymer encapsulation 7 bounding the recess 70,
  said cover 4 having a first lateral end and other parts.

The first lateral end (on the left in the figure) comprises a partially beveled edge face 41 resting (during the assembly) against a first part of the functional element 6 referred to as guiding part 61. The first lateral end being installed mobile in rotation R with respect to the glazing unit about an axis of rotation parallel to the injection edge face 10, the first lateral end being beveled and protruding forming fins 41 along the cover abutted (in a plane) against the assembly element in the shape of a C in local regions 63, as shown in figure if and 1g, and in the other regions, the edge face (left) of the cover 4 coming into contact (in a plane) against the assembly element 6.

At the opposite end of the base, the lateral end 42 (on the right in the figure) abuts against the assembly element 62.

A part 44 of the cover 4 normal to the internal face 4 (in the direction Y and oriented toward the glass) carries means for holding the cover in position in the form of clip-attachment spurs 64, along the cover offset with respect to the bearing regions for the rotation, clipping onto anti-return end stops in the vertical wall 64 of the assembly element 6.

The clip-attachment or rotation regions can just as easily be regions either with or without diode supports 3. The diode supports run longitudinally over most of the length of the cover (facing the recess). The diode support 3 may run longitudinally over (virtually) the whole of the recess 70.

The assembly element 6 furthermore comprises, in a region without diodes, at least one part in contact with the injection edge face 10 forming a stiffener 66 (cf. figure if, 1g) uniting the guiding part. 61 and the clip-attachment part 64 in addition to the lateral parts which close the contour of the assembly element.

The assembly element 6 also comprises means of mechanical anchoring 65 within the encapsulation, of the lateral fins type with orifices (for example holes) preferably regularly distributed all along the fins, so as to allow the infiltration of overmolding material all around them. This ensures a very high mechanical strength between the assembly element and the overmolding.

The glazing unit may comprise a plurality of assembly elements (and of covers with associated diodes) in the form of monolithic elements aligned and locked into one another by temporary fixing means 67. This lock-fit with a controlled positioning allows the same spacing between two LEDs, even from one module to the other (and hence from one assembly element to the other) to be guaranteed.

The design of the cover 4 and of the assembly element 6 thus allows the integration of the diode bar 3 and also allows the focusing of the diodes, in other words the correct positioning of the bar 3 with respect to the injection edge face 10.

Furthermore, the cover could potentially have a blind recess or through-recess (preferably made leak-tight by foam or O-ring seal, etc.) for the passage of the connection elements.

An interface element 5 rendering the interface leak-tight to fluid(s), which interface element is an O-ring seal, made of EPDM, in the form of a band with a width of 5 mm, is on the internal face 40 of the cover in a clearance space 4' of the cover provided for this purpose.

The interface sealing element 5 is a compressed material, the sealing by compression of the material being achieved by a closing force applied by said means for fixing the cover.

Diodes emitting white or colored light may be chosen for ambiance lighting, reading light, etc.

Several bars on different edges may of course be provided, and/or with different functions (appropriate choice of the power, of the emitted light, of the position and of the extent of the extraction areas).

The glazing unit 100 may for example form a fixed panoramic roof for a terrestrial vehicle or, as a variant, for a boat, etc.

The roof is installed from the outside, as shown in FIG. 1c, on the bodywork 90 via an adhesive 91. The extraction, for example a diffusing layer 12', can form ambiance lighting.

Preferably, the functional element 7 then has a sealing lip.

The fabrication of such a glazing unit comprises the following steps:
  followed the placement into a mold of the laminated glazing unit,
  the placement into the mold M of the assembly element 6 on the first sheet and on the second sheet with a cover 4a containing a seal 5a,
  the closing of the mold M over the cover, the compression of the seal 5a, the overmolding by injection of the flexible polymer encapsulation material, notably polyurethane or thermoplastic,
  the removal of the glazing unit from the mold and the removal of the seal from the region facing the injection edge face leaving the accommodation for the source
  the assembly of the cover with the source support then of the cover on the assembly element, by rotation then reversible attachment, or as a variant, the assembly of the source support on the assembly element then the assembly of the cover on the assembly element and on the support preferably by rotation then reversible attachment.

Figure 1I:
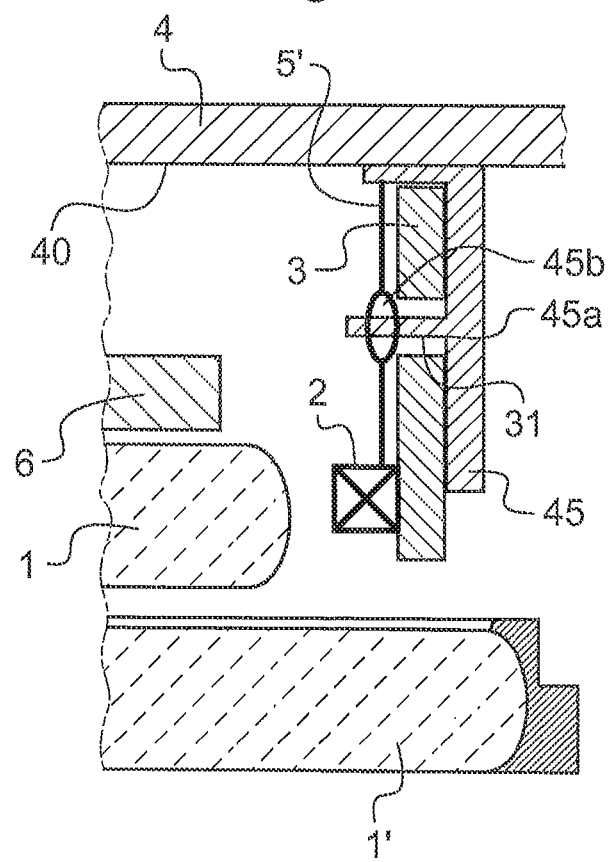

FIG. 1i shows a detailed view of another configuration for installation of the diode support on the cover. The diode support is equipped with orifices 31 for placement with pins of the cover 45a and headers 45b.

The diode support 3 (outside of the diodes) is provided with a tropicalization varnish 5'.

FIG. 2 shows a partial schematic cross-sectional view of an illuminating glazing unit for a vehicle 200 in another embodiment of the invention.

The glazing unit 200 differs from the glazing unit 100 in that:
- the diode support on the cover abuts 45' against the cover and is fixed by adhesive or scratch or self-gripping strip 48a to the vertical wall 45,
- the clip attachment is replaced with a holding in position by scratch or self-gripping strip 48 in a dedicated area (horizontal) of the assembly element 6 remote from the recess 70,
- the overmolding 7 is for example tri-face.

FIG. 3 shows a partial schematic cross-sectional view of an illuminating glazing unit for a vehicle 300 in another embodiment of the invention.

Only the differences with respect to the glazing unit 100 are described.

An alignment end stop for the diodes 67' is provided in the bottom of the accommodation, in the form of a guiding slope for the diode support which is preferably flexible, which end stop is formed by the bottom of the assembly element 6.

As a complement to this end stop (or as a replacement), a metal sheet 68' has been pre-bonded onto the assembly element 6 forming a stray light shield.

Furthermore, the assembly element 6 is bonded to the glazing unit by a glue 91 and there is no overmolding surrounding it.

As a variant, the assembly element is metal (the cover could also be).

FIG. 4a shows a partial schematic cross-sectional view of an illuminating glazing unit for a vehicle 400 in another embodiment of the invention and a top view in FIG. 4b.

The glazing unit 400 differs from the glazing unit 100 in that:
- the rotation is carried out by a system of the ball and socket type 41 on the end of the cover 4 and a cavity with a complementary shape 61 in the assembly element 6,
- the holding clip attachment 64 is external to the recess 70,
- the rods 45 carrying the support 3 end in spurs 45c,
- a part 68 of the assembly element 6, on the bottom of the accommodation 70, on the edge of the internal face of the large glass 1', could form a stray light shield.

FIG. 5 shows a partial schematic cross-sectional view of an illuminating glazing unit for a vehicle 500 in another embodiment of the invention.

The glazing unit 500 differs from the glazing unit 100 in that:
- the means for holding the cover in position 4 are screws 44', passing through the cover 4 and protruding from the internal face 40 of the base, these screws are received in local counter-bores in the assembly element 6, namely threaded holes 64',
- the diodes 2 are of the lateral emission type, the face 21 being lateral to the support (normal to the support 3),
- the cover 4 does not carry the diode support 3 which is positioned by edges 31, 32 of the edge face of the support via lateral end stops 6a, 6b of the assembly element 6 (without adhesive), which support is positioned parallel to the glazing unit 1, with one side on the assembly element 6 and one side on the main face (free) of the first glass sheet 1,
- a spring system 46 pushes on the rear of the support 3 so as to hold it in position,
- preferably the sealing of the support is provided by a varnish (or a potting).

FIG. 6a shows a partial schematic cross-sectional view of an illuminating glazing unit for a vehicle 600 in another embodiment of the invention and FIG. 6b a view in perspective.

The glazing unit 600 differs from the glazing unit 400 in that:
- the assembly element 6 is a roof mounting insert,
- the rotation is carried out by a system of hemispherical studs 61,
- the encapsulation on the face of the large glass 1' acts as a stray light shield,
- The referencing of the glazing unit in the mold with respect to the injection edge face ensures the positioning of the insert 6.

FIG. 7a shows a partial schematic cross-sectional view of an illuminating glazing unit for a vehicle 700 in another embodiment of the invention, and FIG. 7b is a lateral view of it.

Only the differences of the glazing unit 700 with respect to the glazing unit 100 are described:
- the rotation is carried out by a series of spheres 61 in the assembly element and complementary shapes 41 in one end of the cover 4,
- the cover is lateral and not facial,
- the diodes 2 use lateral emission, the support 3 has one end 31' against an end stop 41' of the cover and is held on the cover by an adhesive 9 or a scratch or self-gripping strip,
- the clip attachment 64 is in the plane of the ball and socket 6L

FIG. 8 shows a partial schematic cross-sectional view of an illuminating glazing unit for a vehicle 800 in another embodiment of the invention.

With respect to the glazing unit 700, the clip attachment 64 is normal to the plane of the ball and socket 61.

Figure 9:
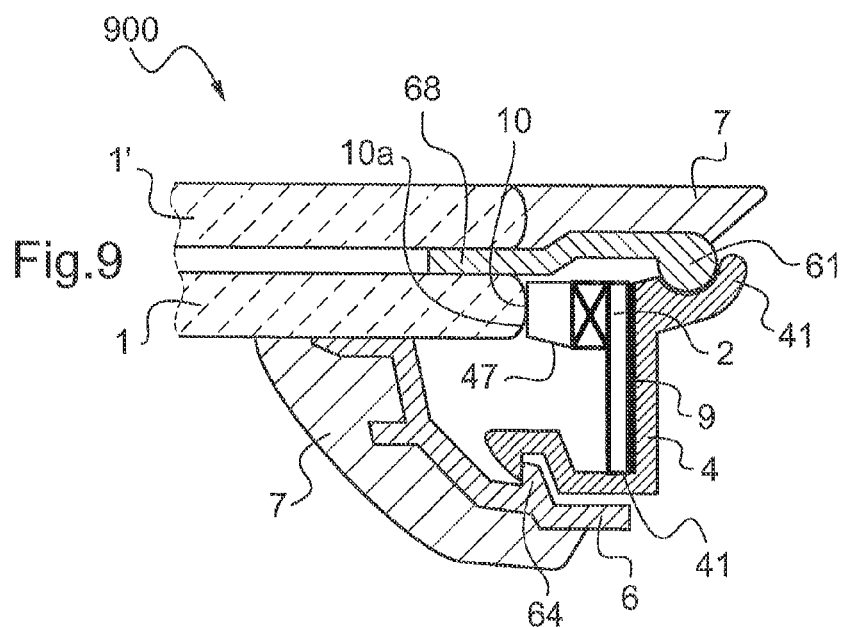

FIG. 9 shows a partial schematic cross-sectional view of an illuminating glazing unit for a vehicle 900 in another embodiment of the invention.

The glazing unit 900 differs from the glazing unit 800 in that the cover 4 is positioned with respect to the injection edge face of the glass by means of one or more elements 47 protruding in the direction of the injection edge face 10 and pushing against the injection edge face in regions 10a without diodes (nor potentially without support).

Figure 10A:
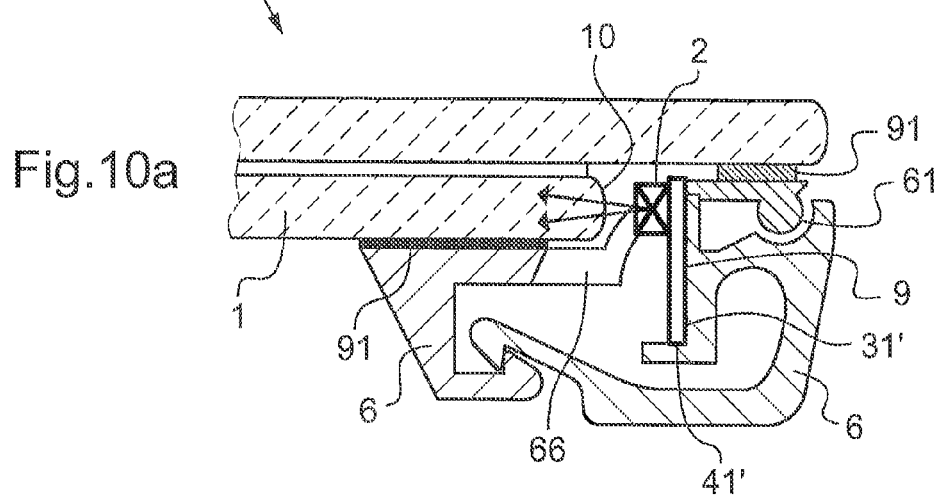

FIG. 10a shows a partial schematic cross-sectional view of an illuminating glazing unit for a vehicle 1000 in another embodiment of the invention.

Figure 10B:
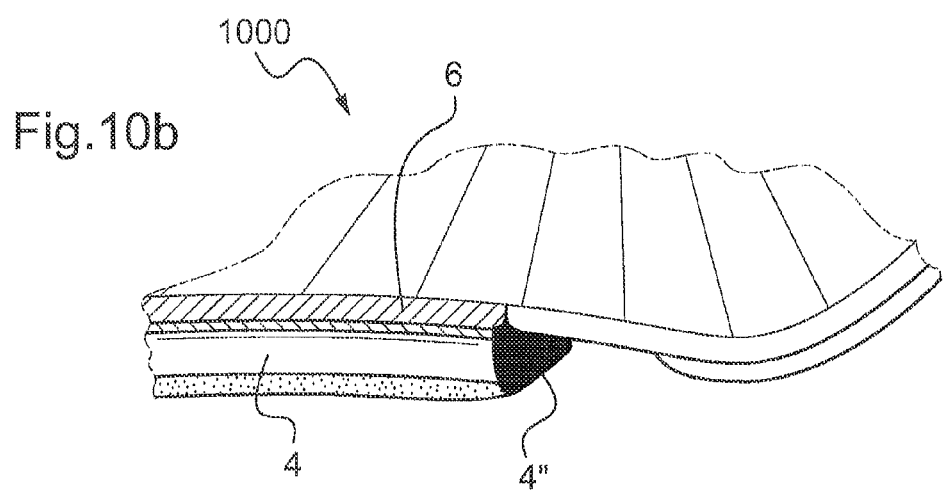

The glazing unit 1000 differs from the glazing unit 800 by:
- the absence of overmolding,
- the adhesive bonding 9 of the assembly element onto the glazing unit,
- the bearing end stop of the cover 31' not extended by the clip attachment,
- a cowling is formed at the ends (cf. FIG. 10b).

FIG. 11a shows a partial schematic cross-sectional view of an illuminating glazing unit for a vehicle 1100 in another embodiment of the invention in a region with a diode. FIG. 11b shows a region without diode supports (with a stiffener 66).

The glazing unit 1100 differs from the glazing unit 800 in that the assembly element is glued, by adhesive 91, onto the glazing unit (edge section of the second sheet and main face of the first sheet 1) and comprises a metal central section locally surrounded (outside of the clip-attachment and rotation regions) by a polymer material 7.

FIG. 12 shows a partial schematic cross-sectional view of an illuminating glazing unit for a vehicle 1200 in another embodiment of the invention.

The glazing unit 200 differs from the glazing unit 500 in that:
- the cover 4 is held by a scratch or self-gripping strip 48 within the encapsulation 7,
- the diode support 3 is held by lateral legs 66' of the assembly element 6 and the positioning is by one or more end stops 6b of the assembly element.

FIG. 13 shows a partial schematic cross-sectional view of an illuminating glazing unit for a vehicle 1300 in another embodiment of the invention.

The glazing unit 1300 differs from the glazing unit 500 by the double clip attachment external to the recess of the cover, clip attachment on the assembly element 6, and the use of flexible tabs 46 instead of a spring. One wall 68 of the assembly element 6 forms a stray light shield on the bottom of the recess 70.

FIG. 14 shows a partial schematic cross-sectional view of an illuminating monolithic glazing unit for a vehicle 1400 in another embodiment of the invention.

The first transparent sheet 1, for example rectangular, is made of organic glass of bi-material polycarbonate both transparent (part 1) and opaque (part 6).

The opaque polycarbonate on the periphery 6 forms the assembly element with end stops 6a, 6b for positioning the support 3.

The injection edge face 10 results from the recess 70 in the sheet 1 (part 6 more precisely) and differs from the edge section 14 of the glazing unit.

The assembly remains by rotation and clip attachment, external to the recess 70, the clip attachment being within a cavity of the black polycarbonate 6, and an accommodation for the ball and socket 61 within a cavity of the black polycarbonate.

The cover 4 has ends 46 which rest against the diode support 3 so as to hold it. The polymer encapsulation 7 is optional.

FIG. 15 shows a partial schematic cross-sectional view of an illuminating monolithic glazing unit for a vehicle 1500 in another embodiment of the invention.

The glazing unit 1500 differs from the glazing unit 1400 in the holding by two hooks 4, 44' on the black polycarbonate 6, one pushed in 64 facing the main face 12 and the other pushed in 64' facing the injection edge face 10, the cover having a generally plane shape with a return, i.e. "L-shaped".

Figure 16A:
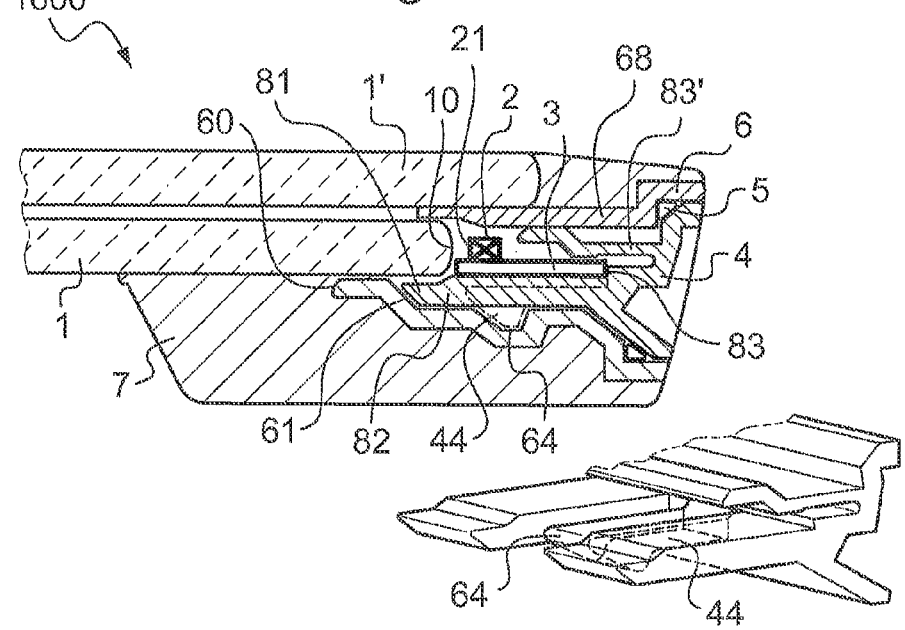
Figure 16B:
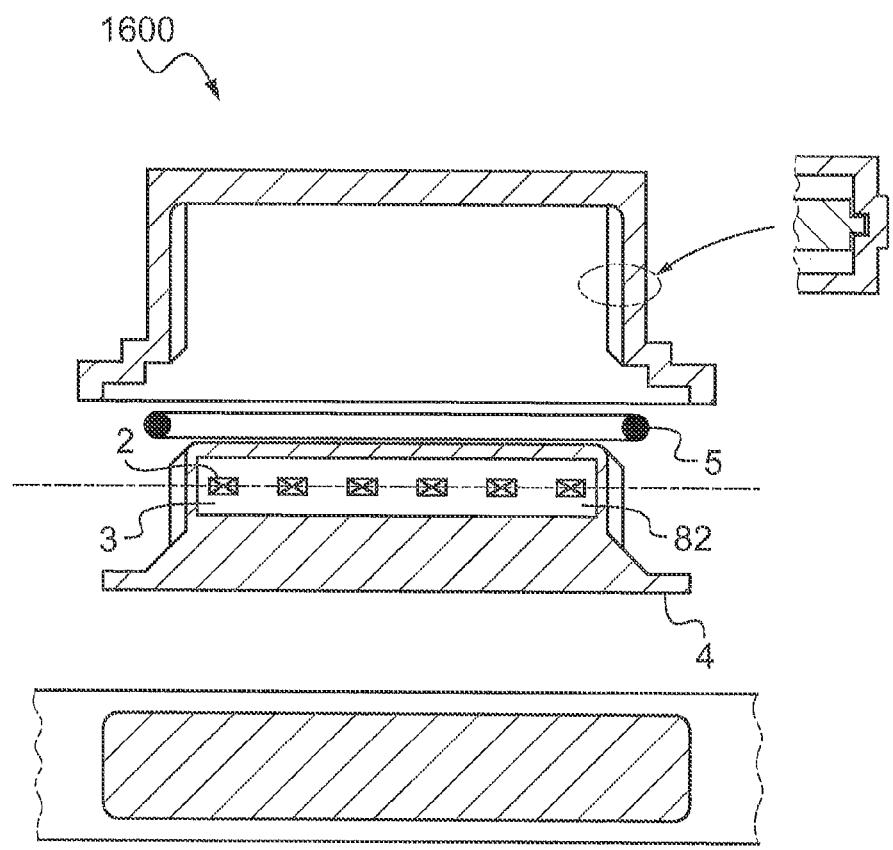

FIG. 16a shows a partial schematic cross-sectional view of an illuminating glazing unit for a vehicle 1600 in another embodiment of the invention and FIG. 16b a top view.

The cover 4 carries the source support 3 which is positioned by means of positional locating elements for holding in position according to the 3 axes of the orthogonal reference frame.

The guiding and the positioning of the cover 4 in two directions of the orthogonal reference frame with respect to the assembly element 6 is achieved by a sliding connection (which could be curved).

Holding the cover 4 in position blocks the third direction of the orthogonal reference frame and hence guarantees the positioning between the emitting face 21 and the injection edge face 10.

The end 81 (on the left in the drawing) of the "drawer" cover 4 carrying the diode support 3:
- is beveled in order to facilitate the introduction of the drawer 4 into the assembly element 6 and in order for it to find its way to the final position at the end of travel, serves as a mechanical end-stop so as to define the final position.

An upward clearance is provided in order to avoid abutting against the glass light guide 1.

The plane part 82 that follows this end 81 therefore receives the diode support 3.

The positional location is achieved by a step 83 on the right of the plane part, and by the plane part.

The LED support 3 is gripped by the upper lip 83' ("interference fit" assembly, held in position by a slight deformation of the component).

Clips 64 are situated on the lower part and distributed along the drawer 4. The clips 64 are offset downward with respect to the plane part 82 in order to allow a deformation of the clip when the clip is attached without coming into collision with the LED support.

A seal 5 (drawn in a constrained state: deformed) is fitted to or formed on the drawer or the assembly element by bi-injection.

The upper part 68 of the assembly element is used as a stray light cover. The protuberance underneath the small glass 1 is used for the sealing with respect to the PU 7 during the injection (pressure exerted by pins in the mold or adhesive bonding or seal, etc.). The stiffeners/end-stops, present in the assembly element 6 in sections outside of the LEDs for the referencing with respect to the injection edge face, are not drawn.

FIG. 17a shows a partial schematic cross-sectional view of an illuminating glazing unit for a vehicle 1600 in another embodiment of the invention and FIG. 17b a top view.

The glazing unit 1700 differs from the glazing unit 1600 by clips 64 in parts lateral to the plane part 82. The guiding is by grooves as shape/counter-shape in the lower part of the drawer 4 and of the assembly element 6.

The installation of the module is carried out by the vertical plane part on the right of the LED support 3, by the vertical protuberance 83 on the left of the LED support (which may be localized or continuous) and the horizontal plane part underneath the module.

The support 3 is held in position (on the drawer 4) by scratch or self-gripping strip/double-sided adhesive/heading.

Figure 18:
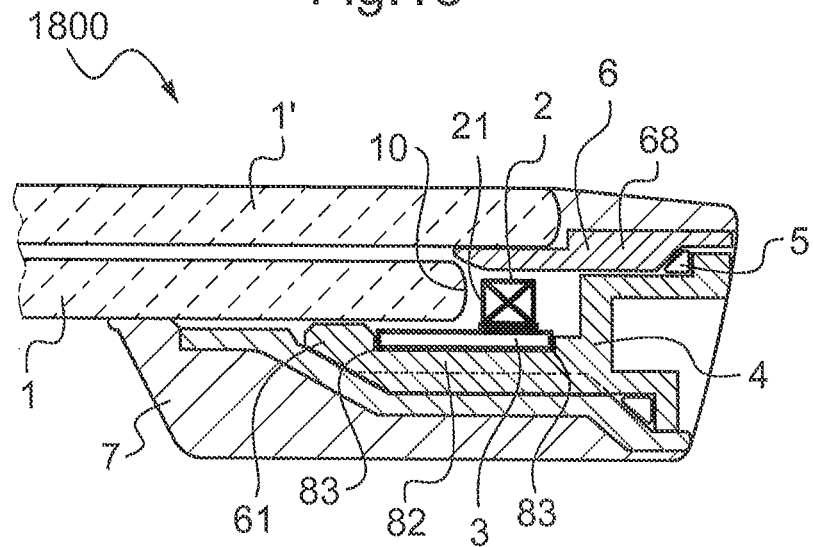

FIG. 18 shows a partial schematic cross-sectional view of an illuminating glazing unit for a vehicle 1800 in another embodiment of the invention.

The glazing unit 1800 differs from the glazing unit 1700 in that the positioning of the LED support against end-stops 83 of the plane part 82 passes under the small glass 1: this gives the advantage of a reduced volume and of a positional holding provided by the small glass 1 in the installed position. Stiffeners/end-stops against the small glass are preferred (on the upper part, for example).

A thin, and hence flexible, part may be added to the drawer in the beveled part which corresponds to a vertical protuberance upward that the small glass bends onto the LED support during assembly (a kind of hinge by material deformation) so as to completely block the vertical movement of the LED support 3.

Figure 19:
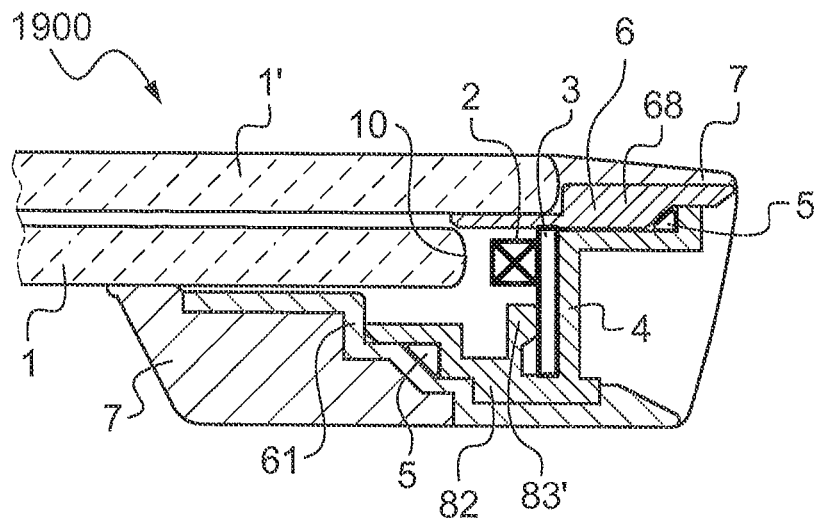

FIG. 19 shows a partial schematic cross-sectional view of an illuminating glazing unit for a vehicle 1900 in another embodiment of the Invention.

Top-Emitting LEDs (instead of Side-Emitting) are used and hence the diode support 3 is vertical (parallel to the injection edge face 10). In this case, there is a vertical plane part 82 and a smaller horizontal part 83 providing end stops for the diode support, and a vertical tab 83' holds the support by local constraint/deformation.

The clip attachment is contained within the assembly element 6, a fact which simplifies the design of the drawer 4. The guiding is, as for the glazing unit 1600, by virtue of lateral grooves outside of the cross-section.

The invention claimed is:

1. An illuminating glazing unit for a vehicle comprising:
a first sheet made of mineral or organic glass having a first main face and a second main face and an edge face,
a peripheral light source with a source support, the peripheral light source being a self-supporting optical fiber with a lateral part forming an emitting region or light-emitting diodes each comprising a semiconductor chip with an emitting face, the emitting region or emitting face facing the edge face of the first sheet for a propagation of injected visible and/or ultraviolet light within the thickness of the first sheet, the first sheet acting as a guide for the injected light,
a light extraction device constructed to extract the guided light in order to form at least one illuminating region,
the source support being within an accommodation surrounded by material and covered by a cover,
the cover and the source support being removable from the glazing unit,
a distance between the emitting face or region and the edge face being controlled by a positional locating device and a positional blocking device for the source support in the three directions of an orthogonal reference frame, said positional locating and blocking devices comprising a system for assembling the source support, associated with the first sheet, including an assembly element positioned with respect to the edge face.

2. The illuminating glazing unit for a vehicle as claimed in claim 1, wherein the system for assembling the source support includes the cover, when the cover carries the source support, the positional locating device for the source support on the assembly element and the positional blocking device for holding the cover in position on the assembly element, or the source support is located in the assembly element independently of the cover and the cover comprises a device for holding the source in position by the cover pushing up against the source support.

3. The illuminating glazing unit for a vehicle as claimed in claim 1, wherein holding of the source support in position is, in part at least, handled by the assembly element.

4. The illuminating glazing unit for a vehicle as claimed in claim 1, wherein the cover is placed in position, on the assembly element, via contact(s) without deformation of the assembly element, using mechanical end stops in the assembly element for the cover carrying the source support.

5. The illuminating glazing unit for a vehicle as claimed in claim 1, wherein the source support is blocked in position, on the assembly element, via contact(s) without overall deformation of the assembly element.

6. The illuminating glazing unit for a vehicle as claimed in claim 1, wherein the cover is reversibly held in position on the assembly element and/or the source support is reversibly blocked in position on the assembly element.

7. The illuminating glazing unit for a vehicle as claimed in claim 1, wherein the device for holding the cover in position on the assembly element, is distinct from the positional locating device for locating the cover on the assembly element.

8. The illuminating glazing unit for a vehicle as claimed in claim 1, wherein the assembly element:
is a monolithic annular element, made of sufficiently rigid plastic and/or of metal, associated with a polymer encapsulation peripheral to the first sheet,
or is a component in several separate parts, made of sufficiently rigid plastic and/or of metal, associated with a polymer encapsulation, peripheral to the first sheet or is made of a sufficiently rigid plastic material with a local recess for accommodating the source, made of polycarbonate for example black or opaque.

9. The illuminating glazing unit for a vehicle as claimed in claim 1, wherein the installation of the cover, potentially carrying the source support or carrying the positional blocking device for the pre-positioned source support, is by rotation and reversible attachment.

10. The illuminating glazing unit for a vehicle as claimed in claim 1, wherein:
the cover carries the source support which is positioned by means of elements for positioning and for holding in position according to the 3 axes of the orthogonal reference frame,
the positioning in two directions of the orthogonal reference frame of the cover with respect to the assembly element is carried out by a sliding connection,
holding the cover in position blocks the third direction of the orthogonal reference frame and hence ensures the positioning between the emitting face or region and the edge face.

11. The illuminating glazing unit for a vehicle as claimed in claim 1, wherein the assembly element comprises, in a non-emitting region, a component facing or in contact with the edge face used for referencing to the edge face and/or forming a stiffener.

12. The illuminating glazing unit for a vehicle as claimed in claim 1, wherein the cover is essentially facial and the source support parallel to the edge face is carried by the cover or the source support is parallel to the first sheet and positioned on the assembly element.

13. The illuminating glazing unit for a vehicle as claimed in claim 1, wherein the assembly element is fixed to the glazing unit, by adhesive bonding, and/or is surrounded by a polymer encapsulation on at least one region on the periphery of the glazing unit and then comprises a device of mechanical anchorage in the encapsulation, of the fins type with orifices.

14. The illuminating glazing unit for a vehicle as claimed in claim 1, wherein the assembly element is a functional element chosen from amongst:
an insert for fixing the glazing unit onto the vehicle or an additional element onto the glazing unit,
a metal central section of a pre-assembled seal being locally hollowed out, potentially covered with a polymer material.

15. The illuminating glazing unit for a vehicle as claimed in claim 1, wherein the glazing unit is a single-layer unit, the first sheet being made of mineral or organic glass, or wherein a second sheet made of mineral or organic glass is laminated by a lamination spacer to the first sheet.

16. The illuminating glazing unit for a vehicle as claimed in claim 1, wherein the source support is positioned in the assembly element by the positional locating device, and the cover comprises or cooperates with elements, which in the installed position of the cover, are the device for blocking the source in position in the assembly element.

17. The illuminating glazing unit for a vehicle as claimed in claim 16, wherein the positional locating device includes end stops in the assembly element.

18. The illuminating glazing unit for a vehicle as claimed in claim 1, wherein the cover is essentially lateral and is positioned and held in the assembly element.

19. The illuminating glazing unit for a vehicle as claimed in claim 18, wherein the covers cover carries the source support.

20. The illuminating glazing unit for a vehicle as claimed in claim 1, wherein the glazing unit comprises a metal sheet arranged along the first main face beyond the emitting face or region and potentially protruding from the edge face forming a stray light shield, or a part of the assembly element, at the bottom of the accommodation, forms a stray light shield.

21. The illuminating glazing unit for a vehicle as claimed in claim 20, wherein, when the glazing unit is laminated, the metal sheet is in a set back region of a lamination spacer between the first sheet and a second sheet.

22. A method of fabrication of the illuminating glazing unit for a vehicle as claimed in claim 1, comprising:
   supplying the first sheet and an optional second sheet followed by the placement and by the fixing using adhesive bonding of the assembly element onto the first sheet and/or the second sheet, and
   assembling the cover with the source support, then assembling the cover onto the assembly element, or assembling the source support on the assembly element then assembling the cover on the assembly element and on the source support.

23. The method of fabrication of the illuminating glazing unit for a vehicle as claimed in claim 22, wherein the assembling of the cover and the source support is by rotation and reversible attachment.

24. A method of fabrication of the illuminating glazing unit for a vehicle as claimed in claim 1, comprising:
   supplying the first sheet and an optional second sheet, followed by the placement into a mold,
   placing into the mold the assembly element on the first sheet, and/or the second sheet, with a cover containing a seal,
   closing the mold on the cover, compressing the seal, overmolding by injection of a polymer encapsulation material,
   removing the glazing unit from the mold and removing the seal from the region facing the edge face leaving the accommodation for the source, and
   assembling the cover with the source support then assembling the cover on the assembly element or assembling the source support on the assembly element then assembling the cover on the assembly element and on the source support.

25. The method of fabrication of the illuminating glazing unit for a vehicle as claimed in claim 24, wherein the assembling of the cover and the source support is by rotation and reversible attachment.

26. An illuminating glazing unit for a vehicle comprising:
   a first sheet made of mineral or organic glass having a first main face, a second main face and an edge face;
   a peripheral light source provided with a source support, the peripheral light source comprising a plurality of light-emitting diodes each comprising an emitting face, the emitting face facing the edge face of the first sheet so that, in use, radiation emitted by the light source enters the edge face and propagates within the thickness of the first sheet, the first sheet acting as a guide for the injected radiation;
   a light extraction device constructed to extract the guided light in order to form an illuminating region;
   wherein the source support is provided within a space surrounded by material and covered by a cover, the cover and the source support being removable from the glazing unit,
   wherein a distance between the emitting face and the edge face is controlled by a system constructed to position and block the source support in three directions of an orthogonal reference frame, said system associated with the first sheet and including an assembly element positioned with respect to the edge face.

27. The illuminating glazing unit for a vehicle as claimed in claim 26, wherein the light extraction device includes scattering elements and/or a diffusing layer arranged on the first main face of the first sheet.

* * * * *